United States Patent
Rivoir

(10) Patent No.: US 11,200,156 B2
(45) Date of Patent: Dec. 14, 2021

(54) TESTER AND METHOD FOR TESTING A DEVICE UNDER TEST USING RELEVANCE SCORES

(71) Applicant: Advantest Corporation, Tokyo (JP)

(72) Inventor: Jochen Rivoir, Magstadt (DE)

(73) Assignee: ADVANTEST CORPORATION, Tokyo (JP)

( * ) Notice: Subject to any disclaimer, the term of this patent is extended or adjusted under 35 U.S.C. 154(b) by 0 days.

(21) Appl. No.: 16/548,653

(22) Filed: Aug. 22, 2019

(65) Prior Publication Data

US 2019/0377670 A1 Dec. 12, 2019

Related U.S. Application Data

(63) Continuation of application No. PCT/EP2017/055372, filed on Mar. 7, 2017.

(51) Int. Cl.
G06F 11/36 (2006.01)

(52) U.S. Cl.
CPC ........ *G06F 11/3692* (2013.01); *G06F 11/368* (2013.01); *G06F 11/3684* (2013.01); *G06F 11/3688* (2013.01)

(58) Field of Classification Search
CPC ............... G06F 11/3692; G06F 11/368; G06F 11/3684; G06F 11/3688
See application file for complete search history.

(56) References Cited

U.S. PATENT DOCUMENTS

| | | |
|---|---|---|
| 5,615,380 A | 3/1997 | Hyatt |
| 6,885,700 B1 | 4/2005 | Kim et al. |
| 8,539,282 B1 * | 9/2013 | Kabanov ............. G06F 11/3688 714/38.1 |
| 8,706,062 B1 | 4/2014 | Yu et al. |
| 2003/0058148 A1 | 3/2003 | Sheen |

(Continued)

OTHER PUBLICATIONS

Abbas, "Entropy Methods for Joint Distributions in Decision Analysis", [Online], 2006, pp. 146-159, [Retrieved from internet on Jul. 27, 2020], <https://ieeexplore.ieee.org/stamp/stamp.jsp?tp=&arnumber=1580900> (Year: 2006).*

(Continued)

*Primary Examiner* — S. Sough
*Assistant Examiner* — Zengpu Wei

(57) ABSTRACT

A tester for testing a device under test is shown, having a test unit configured for performing a test of the device under test using multiple test cases, each test case having variable values of a set of predetermined variables, the test units configured to derive an output value for each test case indicating whether the device under test validly operates at a current test case or whether the device under test provides an error at the current test case; and an evaluation unit configured for evaluating the multiple test cases based on a plurality of subsets of the predetermined input variables with respect to the output value, the evaluation unit configured for providing a number of plots of the evaluation of the multiple test cases where each plot indicates the impact of one subset of the plurality of subsets of the predetermined input variables to the output value in dependence on respective relevance scores or associated with the respective relevance scores.

19 Claims, 18 Drawing Sheets

(56) References Cited

U.S. PATENT DOCUMENTS

| | | |
|---|---|---|
| 2005/0104597 A1 | 5/2005 | Klijn et al. |
| 2005/0114105 A1* | 5/2005 | Barber .................. G05B 17/02 |
| | | 703/2 |
| 2005/0172181 A1 | 8/2005 | Huliehel |
| 2009/0106737 A1* | 4/2009 | Chockler ............ G06F 11/3604 |
| | | 717/126 |
| 2009/0113399 A1 | 4/2009 | Tzoref et al. |
| 2009/0150733 A1* | 6/2009 | Takizawa ........... G01R 31/3191 |
| | | 714/734 |
| 2010/0176815 A1 | 7/2010 | Roth |
| 2011/0032829 A1* | 2/2011 | Rivoir ................ G01R 31/2846 |
| | | 370/242 |
| 2011/0227767 A1 | 9/2011 | O'Brien |
| 2014/0195870 A1 | 7/2014 | Ma |
| 2014/0207440 A1* | 7/2014 | Li ........................ G06F 40/242 |
| | | 704/9 |

OTHER PUBLICATIONS

Yilmaz et al, "Per-Device Adaptive Test for Analog/RF Circuits Using Entropy-Based Process Monitoring", [Online], 2012, pp. 1116-1128, [Retrieved from internet on Jul. 27, 2020], <https://ieeexplore.ieee.org/stamp/stamp.jsp?tp=&arnumber=6248732> (Year: 2012).*

Vassiliadis et al, "Towards Automatic Significance Analysis for Approximate Computing", [Online], 2016, pp. 182-193, [Retrieved from internet on Jul. 20, 2021], <https://ieeexplore.ieee.org/stamp/stamp.jsp?tp=&arnumber=7559543> (Year: 2016).*

Zeller, A. "Yesterday, my program worked. Today, it does not. Why?" Foundations of Software Engineering, Springer-Verlag, Oct. 1999, pp. 253-267.

* cited by examiner

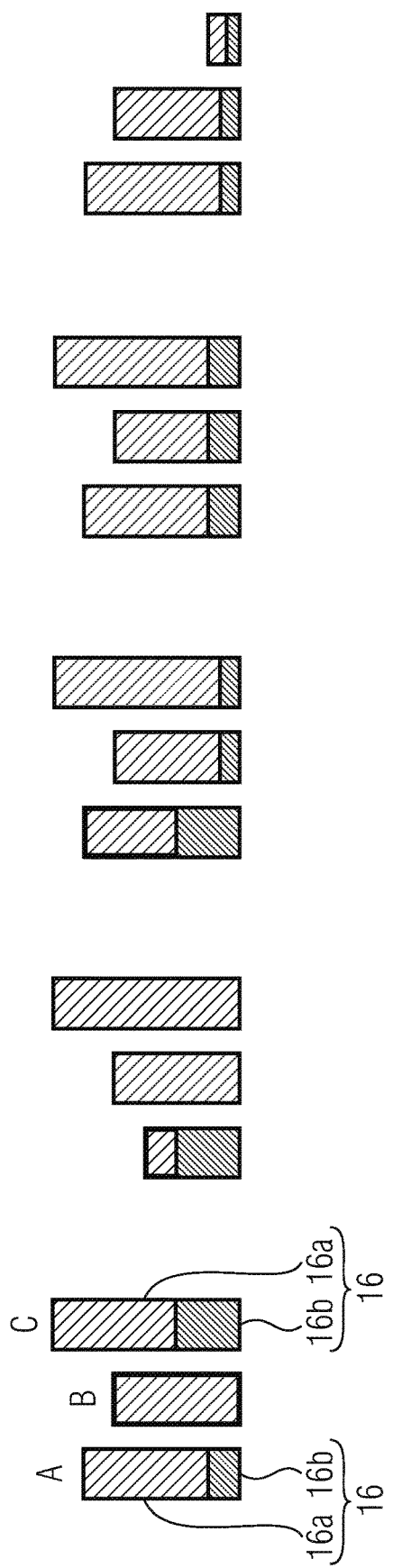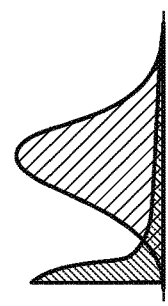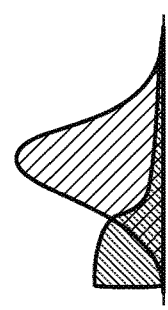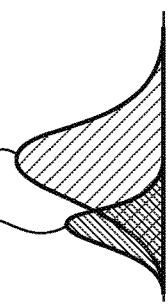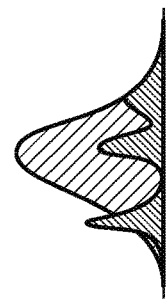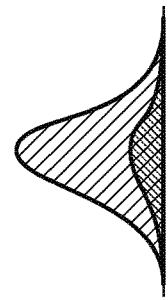

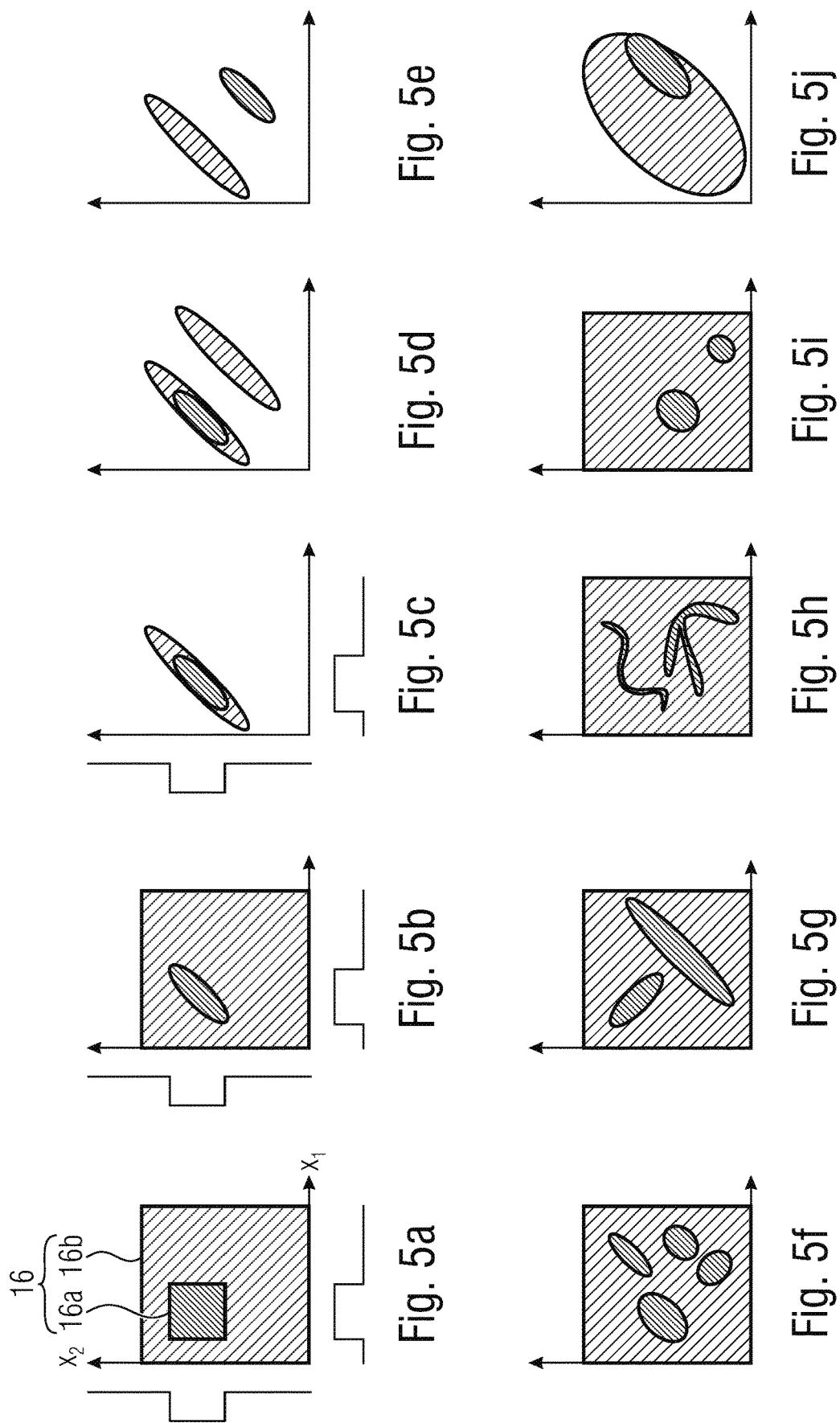

+ overlap
scatter plot

TESTER AND METHOD FOR TESTING A DEVICE UNDER TEST USING RELEVANCE SCORES

CROSS-REFERENCE TO RELATED APPLICATION

This application is a continuation of copending International Application No. PCT/EP2017/055372, flied Mar. 7, 2017, which is incorporated herein by reference in its entirety.

BACKGROUND OF THE INVENTION

This disclosure relates to a tester and a method for testing a device under test using relevance scores. In other words, the proposed method or tester is configured to provide insightful debug plots to a user.

Debugging as analysis of a large number of test cases with many recorded or computed variables involves finding the most influential variables in order to understand the root cause of an error. The final goal is a tool that can present the most insightful plots of the error variable and other selected variables to the designer.

Finding the most influential variables is known as feature selection. Today's information based feature selection algorithms have two deficiencies. First, they ignore the statistical (non-)significance of available data and are thus misled in cases with seldom errors. Second, they aim at improving algorithmic prediction as opposed to presenting information to human beings that cannot recognize arbitrarily distributed information.

The task of identifying an informative subset of variables $X \in (X_1 \ldots, X_M)$ to predict another binary variable Y is known as feature selection, where the targeted prediction is usually some kind of classification algorithm, such as artificial neural networks or decision trees, both of which can deal with highly unstructured error distributions.

In contrast, here analysis and prediction are performed by a human being, who needs to recognize geometric structure in the presented information. No attempt has been made to identify a subset of variables whose plot contains best human recognizable geometric information distribution.

Several published feature selection algorithms are based on information theoretic measures, such as conditional entropy $H(Y|U, V, \ldots)$ or mutual information $(X;Y)$ [Doq-2011], [Fleu-2004]. Information theoretic measures capture all information about error Y when a subset of variables $X \in \{U, V, \ldots\}$ is known. They are neither limited to linear dependencies nor by predefined kernel functions. On the other side, such information theoretic measures are defined point-wise, which makes them invariant under permutations in variable space and thus do not capture geometric structure. Furthermore, they assume known probability distributions. When sample sizes are large, probability distributions can be estimated well by counting errors. However, for small sample sizes, estimation errors can be large and lead to wrong results.

Most feature selection algorithms attempt reducing a huge number of features, sometimes more than the number of tests, to a more tractable number of features. Here, a moderate number of features shall be reduced to a handful features. For efficiency, feature importance is often measured one-by-one, pair-wise at most.

Presently, the determination whether variables or a combination of variables of a device under test during the test procedure has to be manually determined from a great and unordered number of plots by a trained user. Thus, the user has to decide based on a vast amount of plots whether the impact of variables presented in one plot cause an error on the device under test or whether errors occur due to different variables. This manual browsing through, ideally, all variable plots of all single variables, pairs, triplets, and quadrupels of variable values is extremely tedious if at all possible. For example, even with only 20 different variables there are 20 single variable plots, 190 plots of pairs of variables, 1140 plots indicating triplets of variables and 4845 quadrupels of variable plots. In other words, to more than 5200 plots for all combinations of maximum four variables out of 20 different variables may be obtained where the influence of the variables of variable combinations may be determined from. This typically overstrains the user or is at least very time-consuming, at least when assuming more than 100 different variables in one test case or test case.

Therefore, there is a need for an improved approach for determining dependencies between specific variable values and errors of the device under test.

SUMMARY

According to an embodiment, a tester for testing a device under test may have: a test unit configured for performing a test of the device under test using multiple test cases, wherein each test case has variable values of a set of predetermined input variables and wherein the test unit is configured to derive an output value for each test case indicating whether the device under test validly operates at a current test case or whether the device under test provides an error at the current test scenario; and an evaluation unit configured for evaluating the multiple test cases based on a plurality of subsets of the predetermined input variables with respect to the output value, wherein the subsets of input variables are smaller than the set of input variables and wherein the evaluation unit is configured for providing a number of plots of the evaluation of the multiple test cases, wherein each plot indicates the impact of one subset of the plurality of subsets of the predetermined input variables to the output value in dependence on respective relevance scores or associated with the respective relevance scores; wherein the evaluation unit is further configured to determine the relevance scores for the plurality of subsets of the predetermined input variables with respect to the output value, wherein the relevance scores indicate a respective relevance of each of the plurality of subsets for a determination of the impact of the subset of input variables to errors of the device under test.

According to another embodiment, a method for testing a device under test may have the steps of: performing a test of the device under test using multiple test cases, wherein each test case has variable values of a set of predetermined input variables; deriving an output value for each test case indicating whether the device under test validly operates at a current test cases or whether the device under test provides an error at the current test case; evaluating the multiple test cases based on a plurality of subsets of the predetermined input variables with respect to the output value, wherein the subsets of input variables are smaller than the set of input variables; providing a number of plots of the evaluation of the multiple test cases, wherein each plot indicates the impact of one subset of the plurality of subsets of the predetermined input variables to the output value in dependence on respective relevance scores or associated with the respective relevance scores; and determining the relevance scores for the plurality of subsets of the predetermined input variables with respect to the output value, wherein the relevance scores indicate a respective relevance of each of the plurality of subsets for a determination of the impact of the subsets of input variables to errors of the device under test.

Another embodiment may have a non-transitory digital storage medium having stored thereon a computer program for performing the above inventive method when said computer program is run by a computer.

Embodiments show a tester for testing a device under test. The tester comprises a test unit configured for performing a test of the device under test using multiple test cases. Each test case may comprise variable values of a set of predetermined variables. The test units may be further configured to derive an output value for each test case indicating whether the device under test validly operates at a current test case or whether the device under test provides an error at the current test case. Furthermore, the tester comprises an evaluation unit configured for evaluating the multiple test cases based on a plurality of subsets of the predetermined input variables with respect to the output value. The subset of input variables may be smaller than the set of input variables. The evaluation unit may be further configured for providing a number of plots of the evaluation of the multiple test cases where each plot indicates the impact of one subset of the plurality of subsets of the predetermined input variables to the output value in dependence on respective relevance scores or associated with the respective relevance scores. The evaluation unit may be further configured to determine the relevance scores for the plurality of subsets of the predetermined input variables with respect to the output value, wherein the relevance scores indicate a respective relevance of each of the plurality of subsets for a determination of the impact of the subset of the input variables to errors of the device under test.

The present disclosure is based on the finding that it is possible to define an objective relevance score, which is a measure of the significance or the insightfulness of input variables or more specifically specific values of input variables, to errors of the device under test. The automatically generated relevance scores provide the user with the opportunity to select or to order the respective plots plotted using the subset of variable values in order to view the most relevant plots first and to therefore increase the probability that dependencies between certain variables and the errors of the device under test are revealed in one of the first plots which decreases the time needed for debugging the device under test. In other words, the relevance scores are a measure indicating how likely it is for the test engineer to obtain dependencies from the subset of variable values or the respective plot to errors of the device under test.

According to further embodiments, the evaluation unit may determine the relevance scores using an entropy measure. The entropy measure may be calculated as a conditional entropy of an error distribution when seen in dependence on variable values of a given subset of the plurality of subsets of the predetermined input variables if the plurality of subsets is greater than 1. Alternatively, if the plurality of subsets is equal to 1, the entropy measure may be calculated as an entropy of an error distribution when seen in dependence on variable values of a given subset of the plurality of subsets of the predetermined input variables. The entropy is a meaningful measure to specify the information content of an error distribution of errors caused by variable values of input variables of a subset of the predetermined input variables. More specifically, the entropy is a measure for an order or disorder of the distribution of errors. If the distribution of errors is close to a uniform distribution, the entropy is high, but the information content is low, since no dependency of the input variables to the errors can be derived. Nonetheless, the fact that errors of the device under test do not relate to a certain variable is a valuable information as well. If, for example, the entropy indicates that an ambient temperature has no impact on errors of the device under test, elaborate further tests of the device under test being exposed to varying temperatures can be omitted.

According to further embodiments, the evaluation unit may be configured to calculate believability measures as measures for a statistical uncertainty of an error distribution when seen in dependence on variable values of a given subset of the plurality of subsets of the predetermined input variables of a respective one of the plurality of subsets and to adjust the entropy measure using the believability measures to decrease the relevance scores of those subsets of the plurality of subsets of the predetermined input variable with an increasing statistical uncertainty and to increase the relevance score of those subsets of the plurality of subsets of the predetermined input variables with a decreasing statistical uncertainty. The believability measures may reflect the statistical significance of the error distribution over variable values in a specific subset. This is especially valuable if variable values of the input variables are not uniformly distributed and more specifically, if the variable values of the input variables are not dense, i.e., specific possible subranges of the variable values of the input variables are not represented by variable values or at least the number of variable values representing this subrange is too small to obtain a reliable statistical result.

According to further embodiments, the evaluation unit may be configured to determine the relevance scores using a geometrical measure of an error distribution within a value range covered by the values of the predetermined input variables of the subsets. The geometrical measure may be a heuristic to model the relevance score based on the distribution of subranges with many errors over the input variables of the subset of predetermined input variables. For example, if all or most of the errors are located in a distinct area or if errors are located at the borders of a possible value range of the variable values of the input variables is a more valuable information for a user than a distribution of errors where, for example, the majority of errors is located in the center of a possible value range of variable values of the predetermined input variables. Thus, the geometrical measure alone or in combination with the entropy measure provides a relevance score that may reflect the significance of the specific input variables of the subset of input variables and thus to provide the opportunity (to the evaluation unit) rank the plots according to the results of the relevance score and to provide the plots to a user of the tester based on the ranking.

Before embodiments are described in detail using the accompanying figures, it is to be pointed out that the same or functionally equal elements are given the same reference numbers in the figures and that the repeated description for elements provided with the same reference numbers is omitted. Hence, descriptions provided for elements having the same reference numbers are mutually exchangeable.

BRIEF DESCRIPTION OF THE DRAWINGS

Embodiments of the present invention will be discussed subsequently referring to the enclosed drawing, wherein;

FIGS. 2a, 2b, 2c, 2d and 2e illustrate schematic bar diagrams indicating different examples of one-dimensional plots of categorical variables;

FIGS. 3a, 3b, 3c, 3d, and 3e show schematic continuous diagrams comprising examples of one-dimensional plots of continuous variables;

FIGS. 5a, 5b, 5c, 5d, 5e, 5f, 5g, 5h, 5i, and 5j show schematic two-dimensional continuous diagrams indicating different examples of two-dimensional plots of two continuous variables;

DETAILED DESCRIPTION OF THE INVENTION

Figure 1:
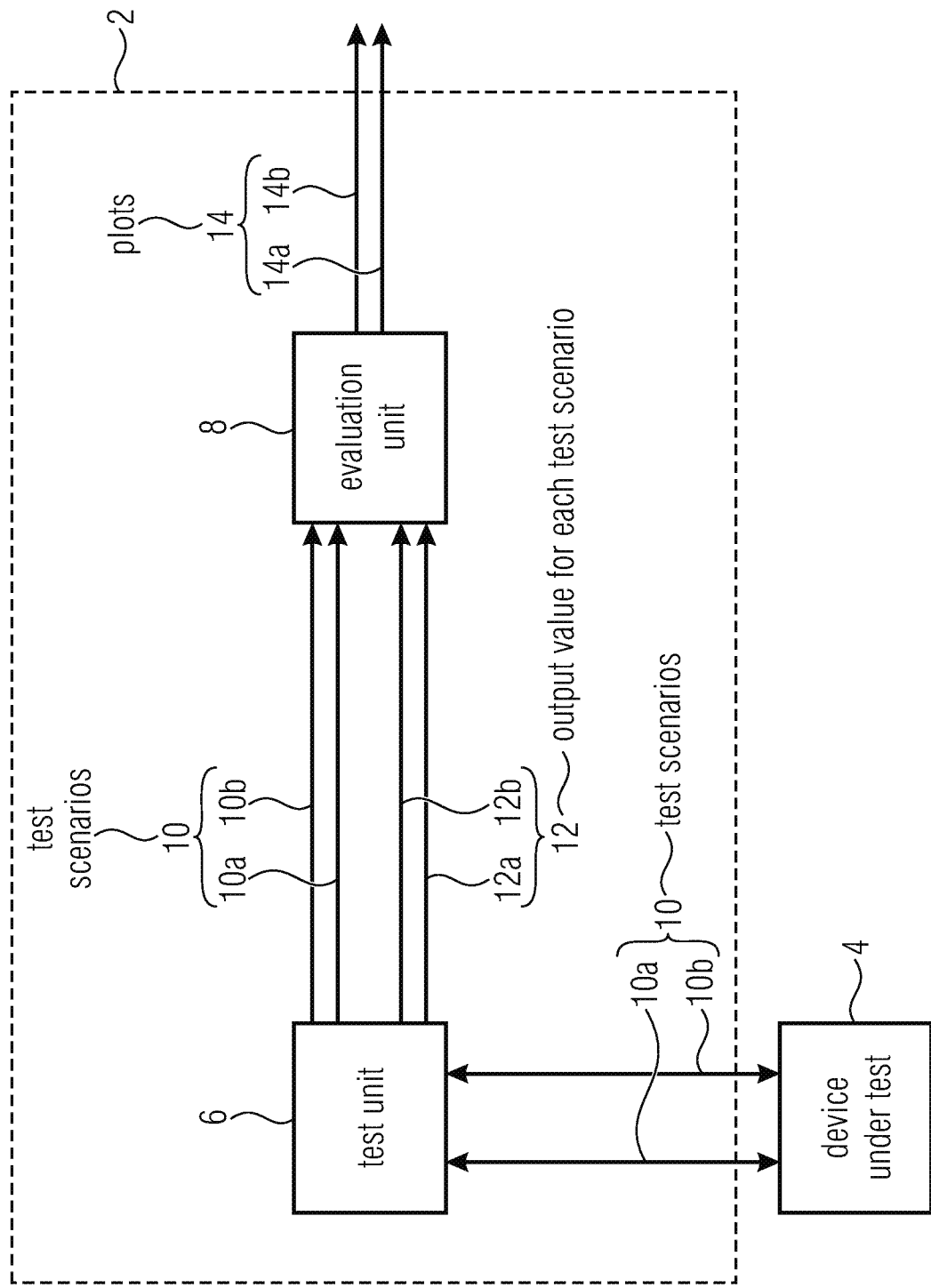
FIG. 1 shows a schematic block diagram of a tester for testing a device under test.

In the following, embodiments of the invention will be described in further detail. Elements shown in the respective figures having the same or a similar functionality will have associated therewith the same reference signs.

This disclosure presents novel scores for variable tuples that take statistical believability and human recognizable information grouping into account. A tool, e.g. directly implemented in the tester or as an external program, can use this score to select the most insightful plots.

A general vision for characterization and debugging based on post processing analysis of a comprehensive test data table is briefly described in the following. The goal is to understanding quantitatively how performance metrics depend on stimuli, settings and conditions and how they vary with process and unknown operating conditions. The test data table may be derived from random permutation of the input variables and the respective input variable values. Thus, the plurality of test cases may be generated randomly on the device under test such that a space of values of variables of all sets of test data is randomly filled more and more by values of variables of a current and previous sets of test data. This enables a user to find dependencies between all variables at a very early stage of a test performance since a great variety of variable values of different variables is tested at an early stage of the test instead of only different variable values for a few variables if a deterministic test is performed. This resulting e.g. randomly generated data table contains binary error variable Y and a large number of numerical or categorical variables.

The goal is identifying a small set of insightful plots, each showing the error variable as a function of one or a few variables, combined into variable tuple X that help designers recognize which combinations of variable values tend to favor or impede occurrence of errors.

Score S(X) for variable tuple X shall quantify how insightful plot (Y,X) is and shall be comparable across different numbers of variables. A tool can scan all tuples up to a specified number of variables and present the designer with a small number of highest ranking plots.

Characteristics of the data table are

The error variable is binary.

Errors can occur deterministically or probabilistically for some variable combination.

In both cases, errors can be seldom, i.e. occur only under specific variable combinations or have a small error probability.

Distributions of test cases and distribution of errors along variables $X_i$ can be highly discontinuous. No assumptions can be made about those distributions.

Errors (or their probability) tend to depend on only a few (1~4) variables.

Knowing when errors are likely or unlikely to occur is equally helpful.

Because designers are expected to add expression variables (feature design, computed from other variables) in order to incorporate domain knowledge, variables can be highly correlated.

A possible implementation is based on point-wise rules for combinations of quantized variable values that are combined later on. This approach incorporates aspects of information (rules) and to some extend also of geometry (combining). The rules-based approach makes it independent of the actual error distributions.

1. The current algorithm tends to favor variables with many different (quantized) values. Possible reason: When errors are very seldom, error cases are captured by a smaller percentage of all possible rules, because there are more possible rules. Yet, this may not be statistically believable, especially when a rule contains only few errors.
2. To mitigate this effect, rules cover a minimum number of test cases (parameter 'Size') to contribute. Consequently test cases in small rules are ignored. An (information-theoretic) approach that takes statistical significance into account would be of advantage, because—particularly when errors are very seldom—information about error cases is too valuable to be ignored.
3. Statistical significance is reflected in an ad-hoc way. This may or may not be a disadvantage.
4. Only the best rules are considered. An information-theoretic approach would likely take all rules into account.
5. Rules for occurrence of errors and rules for non-occurrence of errors are generated separately with separate 'Size' parameters. An information-theoretic approach would likely cover both jointly and consistently.
6. Most aspects of geometric information grouping are not represented, such as concentrated vs smeared out error regions, and proximity to value limits.

The overall empirical error probability of a data table with K errors in N test cases is $\hat{Q}=K/N$. For all rules (combinations of (quantized) variable values) the number of errors, k, and the number of test cases, n, is counted. This is the basis for the following available scores.

Purity, $\hat{q}=k/n$, is simply the empirical error probability. Statistical significance is ignored.

Lift, $\hat{q}/\hat{Q}$, leads to the same ranking, because $\hat{Q}$ is constant for a given data table.

Z-score takes statistical significance of the deviation of a rule's empirical error probability from the average somewhat into account by multiplying it with the square root of the number of samples of that rule, see equation (32). Z-score gives the best result.

Scores are computed separately for errors and non-errors. One may be redundant. However, following will be described a relevance score leading to improved results when compared to the above referenced scores.

FIG. 1 shows a schematic block diagram of a tester 2 for testing a device under test 4. The tester 2 comprises a test unit 6 and an evaluation unit 8. The test unit 6 is configured for performing a test of the device under test 4 using multiple test cases 10, wherein each test case 10a, 10b comprises variable values of a set of predetermined input variables. Furthermore, the test unit 6 may be configured to derive an output value 12a, 12b for each test case 10a, 10b indicating whether the device under test 4 validly operates at a current test case 10 or whether the device under test provides an error at the current test cases 10. The test unit 6 may provide the test cases 10 and the output values 12 for each test case to the evaluation unit 8.

The evaluation unit 8 may be configured for evaluating the multiple test cases 10 based on a plurality of subsets of the predetermined input variables with respect to the output value, wherein the subsets of input variables are smaller than the set of input variables. The evaluation unit may further be configured for providing a number of plots 14 of the evaluation of the multiple test cases 10, wherein each plot 14a, 14b indicates the impact of one subset of the number of subsets of the predetermined input variables to the output value in dependence on respective relevance scores or associated with the respective relevance scores. The subsets of input variables may, for example, comprise a single variable, two variables, three variables, or four variables. However, the size of the subsets is not limited to the aforementioned numbers of input variables.

Moreover, the evaluation unit may be further configured to determine the relevance scores for the plurality of subsets of the predetermined input variables with respect to the output value, wherein the relevance scores indicate a respective relevance of each of the plurality of subsets for a determination of the impact of the subset of input variables to errors of the device under test. The errors are indicated by the output value, which may be a binary error variable. This output value may be determined by the test unit 6 when receiving measurement values from the device under test in response to a stimulation of the device under test with variable values from the respective cases. Therefore, the test unit may have defined threshold values for the respective measurement values in which a device under test 4 validly operates and above or below which the device under test provides an error. Additionally or alternatively, the device under test may indicate, for example, as a measurement value, or by not providing (some of) the measurement values that an error occurred.

The determination of the impact of the subset of input variables to errors of the device under test may be performed manually or by inspection. In other words, the relevance scores provide a measure for a test engineer whether a determination of the impact of the subset of input variables to the errors of the device under test may be performed easily or with a high effort or that it is even not possible. However, the actual determination of the impact may be performed by the test engineer who, however, may start analyzing the respective plots starting with those plots having the highest associated relevance scores. These plots offer the highest probability to find the desired impact of the subsets of input variables to the errors of the device under test. In other words, the determination may refer to an extraction or an analysis of the impact of the subset of input variables to errors of the device under test.

To better understand the benefit of the relevance score, examples of insightful and non-insightful plots will be shown in the following. Thus, the relevance score of an insightful plot should be higher than a relevance score for a non-insightful plot. The following figures, i.e. FIGS. 2 to 5, indicate the output values 16 having error cases (Y=1) 16a and good cases (Y=0) 15b.

FIGS. 2a, 2b, 2c, 2d and 2e illustrate schematic bar diagrams indicating different examples of one-dimensional plots of categorical variables. Example of FIG. 2a) is very insightful, because value B ensures NO errors. Example of FIG. 2b) is very insightful, because errors occur ONLY for value A. Example of FIG. 2c) is insightful, because value A has believably higher error percentage than average. Example of FIG. 2d) is not insightful, because all values have similar error percentages. Example of FIG. 2e) has not enough data, to state a believably higher error percentage for value C.

FIGS. 3a, 3b, 3c, 3d, and 3e show schematic continuous diagrams comprising examples of one-dimensional plots of continuous variables. Example of FIG. 3a) contains no information, because errors are equally likely for all x values, since the distribution of errors is just a down-scaled version of the distribution of no-errors. Example of FIG. 3b) contains some information, because the distributions of errors and non-errors have different shapes. It is not very insightful though, because errors occurs in different value regions and have no easily recognizable form. Example of FIG. 3c) is more insightful, because errors are confined in one smallish value region. Example of FIG. 3d) is even more insightful, because the errors concentrate near one value limit and distributions of errors and non-errors have little overlap. Example of FIG. 3e) is most insightful, because errors are most concentrated in a small value region near one value limit and the distributions of errors and non-errors have almost no overlap.

Figure 4A:
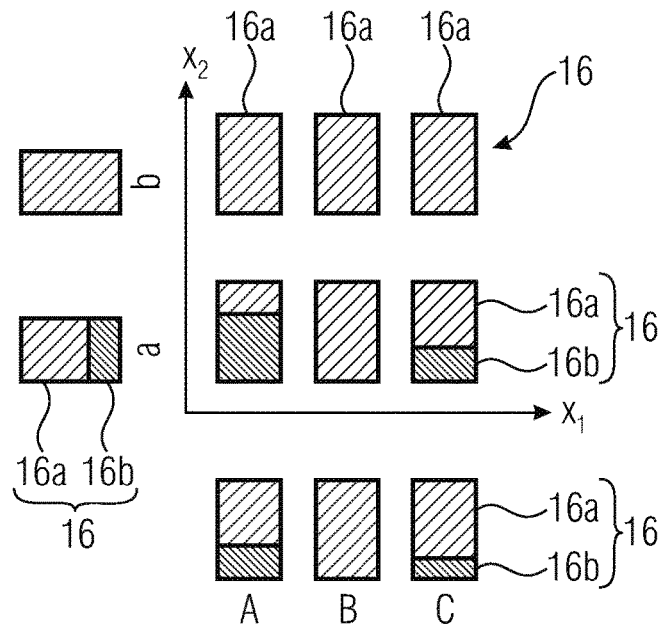
FIGS. 4a, 4b, and 4c show schematic two-dimensional bar diagrams with different examples of two-dimensional plots of two categorical variables.
Figure 4B:
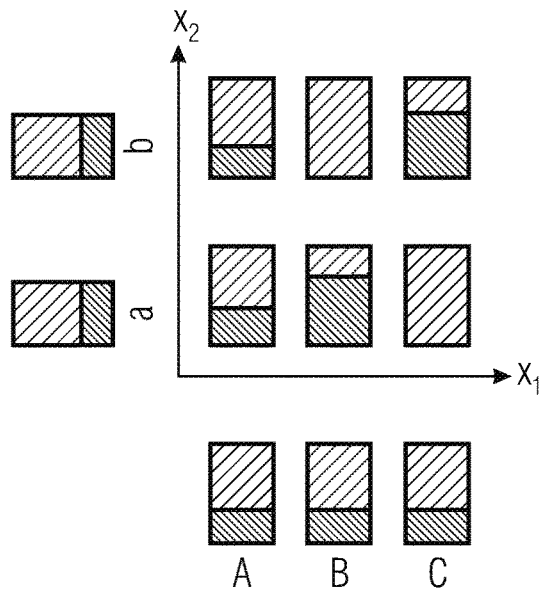
Figure 4C:
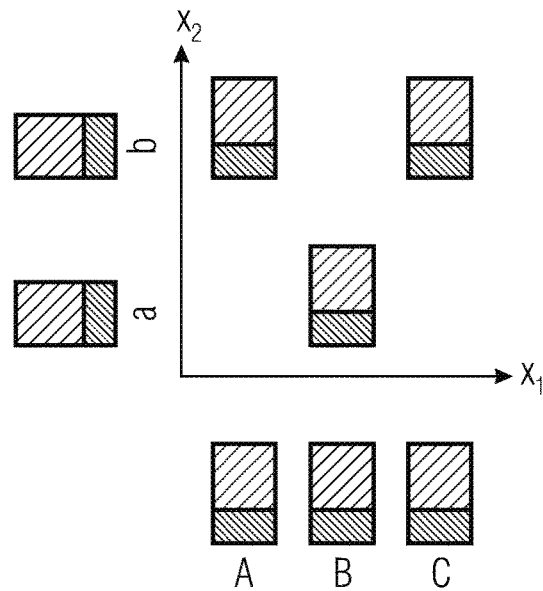

FIGS. 4a, 4b, and 4c show schematic two-dimensional bar diagrams with different examples of two-dimensional plots of two categorical variables. The joint distribution in example of FIG. 4a) contains no additional information beyond the distributions along $x_1$ and the distribution along $x_2$. Example of FIG. 4b) is insightful. Although the error distributions along $x_1$ and the distribution along $x_2$ are both uniform, the distribution along $x_1$ is different for $x_2=a$ compared to $x_2=b$. Example of FIG. 4c) contains no information about errors at all. Although the error distributions along $x_1$ vary across different $x_2$ values, reachable variable combinations vary in the same way. There is no information that allows predicting errors as a function of $x_1$ or $x_2$.

FIGS. 5a, 5b, 5c, 5d, 5e, 5f, 5g, 5h, 5i, and 5j show schematic two-dimensional continuous diagrams indicating different examples of two-dimensional plots of two continuous variables. Example of FIG. 5a) provides no additional information beyond the error distributions along variables $x_1$ and $x_2$. Example 5b) is insightful, because errors occur only within a small ellipsoid region, whereas the individual distributions along $x_1$ and $x_2$, suggest a small rectangular region. Example 5c) is not insightful, because reachable variable values of $x_1$ and $x_2$ are highly correlated. Errors can only occur within a small ellipsoid region. Knowing the error distributions along variable $x_1$ implies knowing the error distribution along variable $x_1$, or vice versa. The joint distribution along $x_1$ and $x_2$ provides no additional information. Example 5d) is again insightful, because errors occur in only one of two possible value regions. It would be even more insightful, if a variable were known that discriminates between the top left ellipsis and the bottom right ellipsis. Example 5e) is very insightful, because error region and non-error region do not overlap. Example 5f) is not very insightful, because it contains several error regions. Example 5g) is slightly more insightful, because it contains only two contiguous error regions. Example 5h) is not as insightful as example g), because error regions have unrecognizable shapes. Example 5i) is more insightful than example g), because error regions are closer to spherical regions. Example 5j) is most insightful, because there is only one compact error region, close to the right boundary of reachable variables values.

For a plot indicating categorical and continuous variables, it may be referred to the above described plots which may be analogously applied. Distributions along continuous variable u shall vary across different values of categorical variable v.

Following will be described criteria for insightful plots. Intuitively speaking, a plot is most insightful. If
1. Error regions occupy a small fraction of the reachable region.
2. Error regions have little overlap with non-error regions
3. There are few contiguous error regions 4. Error regions are compact (close to spherical) as opposed to spread out.
5. Error regions are located near a boundary of reachable variable values
6. It contains additional information beyond other plots.
   The score shall include aspects of statistically believable information as well as aspects of (geometrical) human recognizable information grouping.
   The score shall include aspects of statistically believable information as well as aspects of (geometrical) humane recognizable information grouping.

Furthermore, insightfulness shall not depend systematically on the number of quantized bins.

Figure 6:
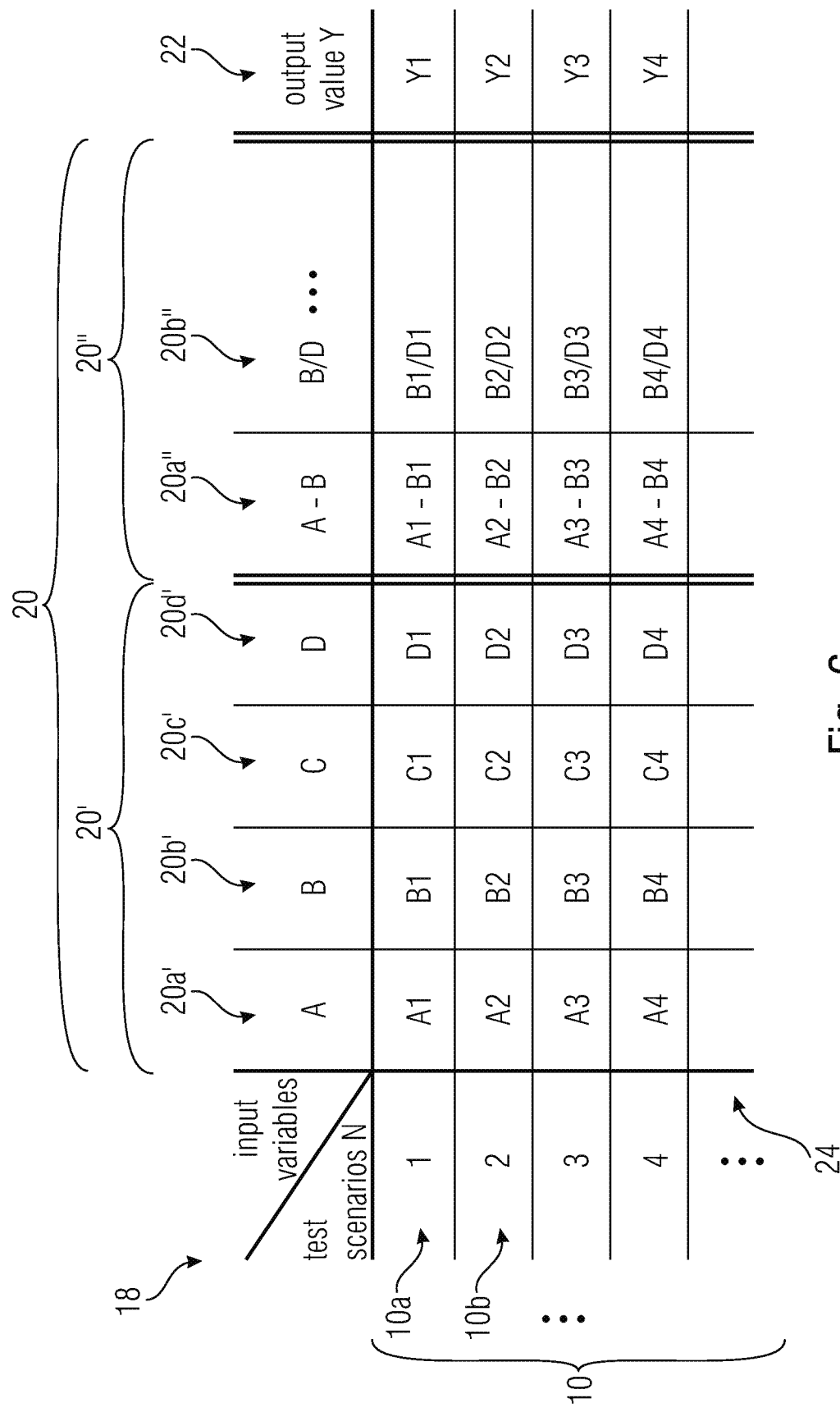
FIG. 6 shows a schematic data table indicating four exemplary test cases.

FIG. 6 shows a schematic data table 18 exemplarily indicating four test cases 10. Each test case is represented by one row of the data table 18. The input variables 20 are aligned in the columns of the data table 18, wherein the last column indicates the output value 22. Moreover, Just for clarification, the variable values 24 are the elements of the data table (or array or matrix) 18 at the respective crossings of the input variables or the transformation variables with the respective test cases. The input variables may be further subdivided in input variables 20' provided or subjected to the device under test during test and the transform variables 20" derived from the input variables 20' by a mathematical operation performed on each variable value of two or more input variables 20'. Thus, the evaluation unit may be configured to calculate a transformation variable using, for each case, at least two variable values of input variables 20' and to extend the set of input variables 20' by the transformation variable 20" such that an extended set of input variables 20 is formed. The evaluation unit may further evaluate the multiple test cases 10 based on the plurality of subsets of the extended set of predetermined input variables 20. More specifically, the evaluation unit may perform a coordinate transform (of the subset of the predetermined input variables of the respective plot) such that a functional dependency of the input variables, whose variable values are used to calculate the transformation variable, is obtainable or actually obtained.

For example, the transformation variable 20a" indicates a difference between the input variables 20a' and 20b' and the transformation variable 20b" indicates a division of input variable 20b' by input variable 20d'. To derive the transformation variables 20", the mathematical operation may be performed on at least two input variables of the same kind. Therefore, for example, two different input voltages of the device under test, for example subjected to two different sub-elements of the device under test, may be subtracted to derive an insight into the influence of the difference of these two voltages with respect to the output value 22. Thus, the input variables may be referred to as the extended set of variables 20 for deriving the influence of any variable to an error of the device under test indicated by the output value 22. The subset of input variables may be formed by any combination or permutation of, for example 1, 2, 3, or 4 of the variables 20a', 20b', 20c', 20d', 20a", 20b". Note, that typically the set of input variables 20' already comprises between 100 to 200 different variables such that including the transformation variables 20", permutations of, for example, 500 different variables may be tested.

According to embodiments, however, a count of the plurality of subsets of the extended set of predetermined input variables 20 is smaller or equal than four. In other words, the maximum number of input variables for each subset or each plot may be limited to four, since a errors of the device under test typically depend on no more than four different variables. Thus, assuming 100 variables to be tested with respect to the influence of exactly three of the 100 input variables to the output value, $$\frac{100 \cdot 99 \cdot 98}{3 \cdot 2 \cdot 1} = 161,700$$

permutations may be performed to calculate a respective relevance score for each of the permutations. Without the relevance score, a test engineer would have to skim through all 182,700 respective plots to determine the impact of exactly three variables of the 100 input variables to the errors of the device under test, not to mention the additional effort to check combinations of single, two or four variables.

Assume a data table of N test cases, n=1 ... N, containing binary error variable Y with values $y(n) \in Y=B$ and M numerical or categorical variables $V_m$, m=1 ... M with (quantized) values $v_m(n) \in V_m$. Numerical variables are normalized to range [0,1]. Using quantized variable values is advantageous with respect to the creation of cells described e.g. with respect to FIG. 18. Thus, original unquantized variable values are will be omitted or not used in this disclosure.

Consider a subset of T variables $X_t = V_m$, t=1 ... T with values $x_t(n) \in X_t$, combined to tuple X. To simplify notation, numerical tuple variables are the first $T_{num} \leq T$ variables. Specific tuples x(n) in the data table are combinations of tuple variable values $x(n)=(x_1, (n) \ldots, x_T(n))$, with $x(n) \in X = X_1 x \ldots x X_T$. A plot (Y,X) shows error variable values y(n) as a function of tuples variable values $x(n)=(x_1, (n) \ldots, x_T(n))$. Theoretically possible tuple values X, independent of whether they exist in the data table, will be called cells, uniquely identified by cell number $c(x) \in \{1, \ldots, C=|X|\}$.

The goal of this disclosure is defining a score S(X) for tuple X that measures how insightful plot (Y,X) is for designers in order to recognize which combinations of variable values tend to favor or impede occurrence of errors. A tool can use this score to select the most insightful plots.

As outlined above, a plot is considered most insightful when it contains a lot of information and when the information is distributed geometrically in a human recognizable form. The idea is therefore defining a score for variable tuples, which consists of two weighted parts. The first part measures the amount of statistically believable information in a plot (Y,X), regardless how hidden the information is. The second part measures how recognizable the information is as geometric structure.

$$S(X) = \alpha_{info} S_{info}(X) + \alpha_{Geom} S_{Geom}(X) \quad (1)$$

Both parts are normalized such that 1 is the best possible value, while 0 is the worst possible value. This score shall be comparable across different numbers of variables.

In other words, the evaluation unit may be configured to calculate the relevance score using a weighted ($\alpha_{info}$, $\alpha_{Geom}$) sum of the entropy measure ($S_{info}$) and a geometrical measure ($S_{Geom}$).

Statistically Believable Information

A plot (Y,X) is informative w.r.t. error variable Y, when, after having seen the plot, the occurrence of errors can be predicted with low uncertainty, assuming the values of tuple variable X are known. This uncertainty can be quantified by the conditional entropy H(Y|X), which assumes knowing the conditional error probability distribution across all tuple values. When the error distribution shows high error probability for few tuples and very low probabilities otherwise, the plot is very informative. On the other side, when the error distribution is rather flat, i.e. when error probabilities deviate only a little from overall error probability, little is known about error inducing conditions and the plot is not very informative. Conditional error probabilities can be estimated by simply counting errors for all tuple values, however with large uncertainty when there are only few errors. The idea is therefore quantifying how believable conditional error probabilities are and weighting their deviations from the overall error probability with a believability factor. This results into a smoothening of the error probability distribution, which reflects the reduced information content in statistically less believable tuples. The believable information content is then computed from the smoothened believable conditional error probability distribution.

According to embodiments, the evaluation unit may be configured to determine the relevance scores using an entropy measure. If the number of input variables in the subsets of the predetermined input variables is greater than 1, the evaluation unit is configured to determine the entropy measure using a conditional entropy of an error distribution when seen in dependence on input variables or the respective variable values of a given subset of the plurality of subsets of the predetermined input variables. Alternatively, if the number of input variables in the subsets of the predetermined input variables is equal to 1, the evaluation unit is configured to determine the entropy of an error distribution when seen in dependence on input variables or the respective variable values of a given subset of the plurality of subsets of the predetermined input variables. In other words, the entropy or the conditional entropy may be determined from a projection of the errors into the planes of the respective variables from the subset of input variables. Thus, the error distribution in the subset of input variables may be determined.

Conditional Entropy

Conditional entropy H(Y|X) [Cov-2006, page 17] quantifies the uncertainty of random error variable Y, when tuple variable X is known, i.e. when the values of all tuple variables $X_t$, t=1 ... T are known. Small entropy close to zero indicates little remaining uncertainty and thus an informative plot. The conditional entropy can be computed from the known joint probability distribution P(y,x) and known conditional probability distribution p(y|x) as $$H(Y|X) = -\sum_{y \in Y} \sum_{x \in X} p(y,x) \log_2 p(y|x). \quad (2)$$

Both distributions can be estimated by simply counting the number of errors k(x) and the number of test cases n(x) for all tuple values x.

$$\hat{p}(y=0, x) = \frac{n(x) - k(x)}{N} \quad (3)$$

$$\hat{p}(y=1, x) = \frac{k(x)}{N}$$

$$\hat{p}(y=0 | x) = \frac{n(x) - k(x)}{n(x)},$$

$$\hat{p}(y=1 | x) = \frac{k(x)}{n(x)}$$

where y=0 indicates 'no error', y=1 indicates 'error', and N is the total number of test cases across all tuple values.

$$N = \sum_{x=X} n(x) \quad (4)$$

Similarly, K is the total number of errors across all tuple values.

$$K = \sum_{x=X} k(x) \quad (5)$$

The empirical overall error probability $\hat{Q}$ is the fraction of all K errors in all N test cases.

$$\hat{Q} = \frac{K}{N} \quad (6)$$

Similarly, the empirical conditional error probability $\tilde{q}(x)$ for a specific tuple values x is $$\hat{q}(x) = \hat{p}(y=1 \mid x) = \frac{k(x)}{n(x)}. \quad (7)$$

Using equations (3) and (7) in (2) and factoring out n/N yields $$\hat{H}(Y \mid X) = -\sum_{x \in X} \frac{n(x)}{N}[(1-\hat{q}(x))\log_2(1-\hat{q}(x)) + \hat{q}(x)\log_2 \hat{q}(x)] \quad (8)$$

Note, x values with n(x)=0 are excluded from the sum and $a \cdot \log_2(a) = 0$ Believable Deviation According to further embodiments, the evaluation unit may be configured to calculate the believability measures as measures for a statistical uncertainty of an error distribution when seen in dependence on input variables or the respective variable values of a given subset of the plurality of subsets of the predetermined input variables of a respective one of the plurality of subsets. Furthermore, the evaluation unit may adjust the entropy measure using the believability measure to decrease the relevance scores of those subsets of the plurality of subsets of the predetermined input variables with an increasing statistical uncertainty and to increase the relevance score of those subsets of the plurality of subsets of the predetermined input variable with a decreasing statistical uncertainty. The error distribution when seen in dependence on input variables of a given subset of the number of subsets of the predetermined input variables may refer to a projection down to a space defined by the input variables of the given subset and a respective error distribution within this space.

In other words, above estimates can be very inaccurate when errors are seldom or when there are many variables and thus few test cases n(x) for a given tuple value. Example: Assume a data table with K=2,000 errors in N=10,000 test cases, and k=1 error in n=20 test cases for a specific tuple value. The overall error fraction is $\hat{Q}$=K/N=0.2, which is a good estimate of the true error probability, Q=$\hat{Q}$, because the total number of errors is large. If this specific tuple value behaved like average, $\hat{k}$=$\hat{Q}$n=0.2·20=4 errors were expected, however assume only k=1 error was found. This corresponds to an empirical conditional probability of $\tilde{q}$=1/20=5% but may also just represent an unlikely case.

The remainder of this subsection will propose several alternative measures for how believable the empirical conditional error probability is.

Binomial Distribution

The probability of finding at most k errors with probability $\hat{Q}$ in n cases is given by the cumulative binomial distribution [Wiki1].

$$Pr(k' \leq k) = F_{n,\hat{Q}}(k) = \sum_{i=0}^{k} B_{n,\hat{Q}}(i) = \sum_{i=0}^{k} \binom{n}{i} \hat{Q}^i (1-\hat{Q})^{n-i} \quad (9)$$

Similarly, the probability of finding k or more errors with probability $\tilde{Q}$ in n cases is $$Pr(k' \geq k) = 1 - Pr(k' \leq k-1) = 1 - F_{n,\tilde{Q}}(k-1). \quad (10)$$

Figure 7:
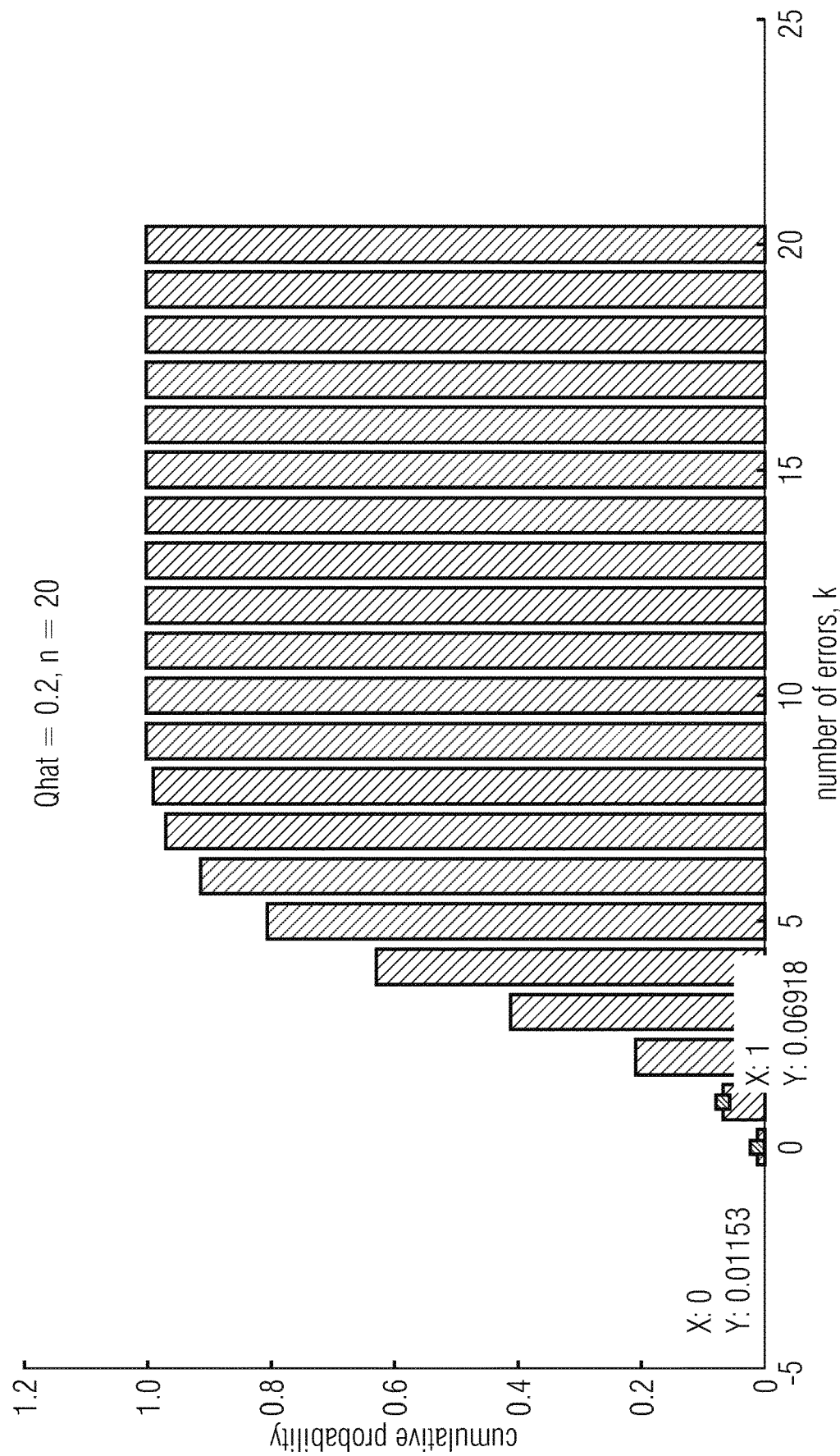
FIG. 7 shows a schematic bar diagram indicating a cumulative probability of finding k errors with probability 0.2 in 20 test cases.

FIG. 7 shows the cumulative probability of finding k errors for above example, assuming the true conditional probability is $\hat{Q}$=20%.

In this example, the probability of finding k=1 or fewer errors is $F_{20,0.2}(1)$=6.9%, again assuming the true conditional error probability is $\hat{Q}$=20%. However, because the number of found errors k is known for a given tuple value, while the true conditional error probability is not, it is more helpful to assume that the true conditional error probability is below $\hat{Q}$=20%, with 100%−0.9%=93.1% confidence, in general $$p_- = 1 - Pr(k' \leq k) = 1 - F_{n,\tilde{Q}}(k). \quad (11)$$

If a minimum 95% confidence was needed, the empirical conditional error probability of, in this example, $\tilde{q}$=5% would not be considered statistically significant and data from this tuple value could not contribute. Ignoring data is highly undesirable, especially when errors are very seldom. Therefore a restriction to statistically significant deviations is discarded as means to qualify empirical conditional probabilities.

According to further embodiments, the evaluation unit may be configured to calculate the believability measure using a confidence of deviations [$b_{Conf}$] of the errors which is calculated using a computation of a deviation between a probability that an empirical error probability of the given subset is greater or equal to an overall error probability and a probability that the empirical error probability of the given subset is smaller than the overall error probability.

In other words, instead of the significant deviation, one idea is to use above confidence level itself to measure how believable the empirical conditional error probability is, without any limit below which data is discarded.

Analog to $p_-$ of equation (11), the confidence $p_-$ that the true conditional error probability is higher than $\hat{Q}$, is $$p_+ = 1 - Pr(k' \geq k) = F_{n,\tilde{q}}(k-1). \quad (12)$$

In above example, this is very unlikely. The corresponding confidence is only $p_+ = F_{20,0.2}(0) = 1.2\%$.

Believability factor b is now defined as the difference of both confidence levels.

$$b_{Conf} = \Delta p = p_+ - p_- 1 \leq b \leq +1 \quad (13)$$

A value near +1 indicates a high probability for q>$\hat{q}$, a value near −1 indicates a high probability for q<$\hat{q}$ while a value near 0 indicates little reason to assume that q≠$\hat{q}$.

Figure 8:
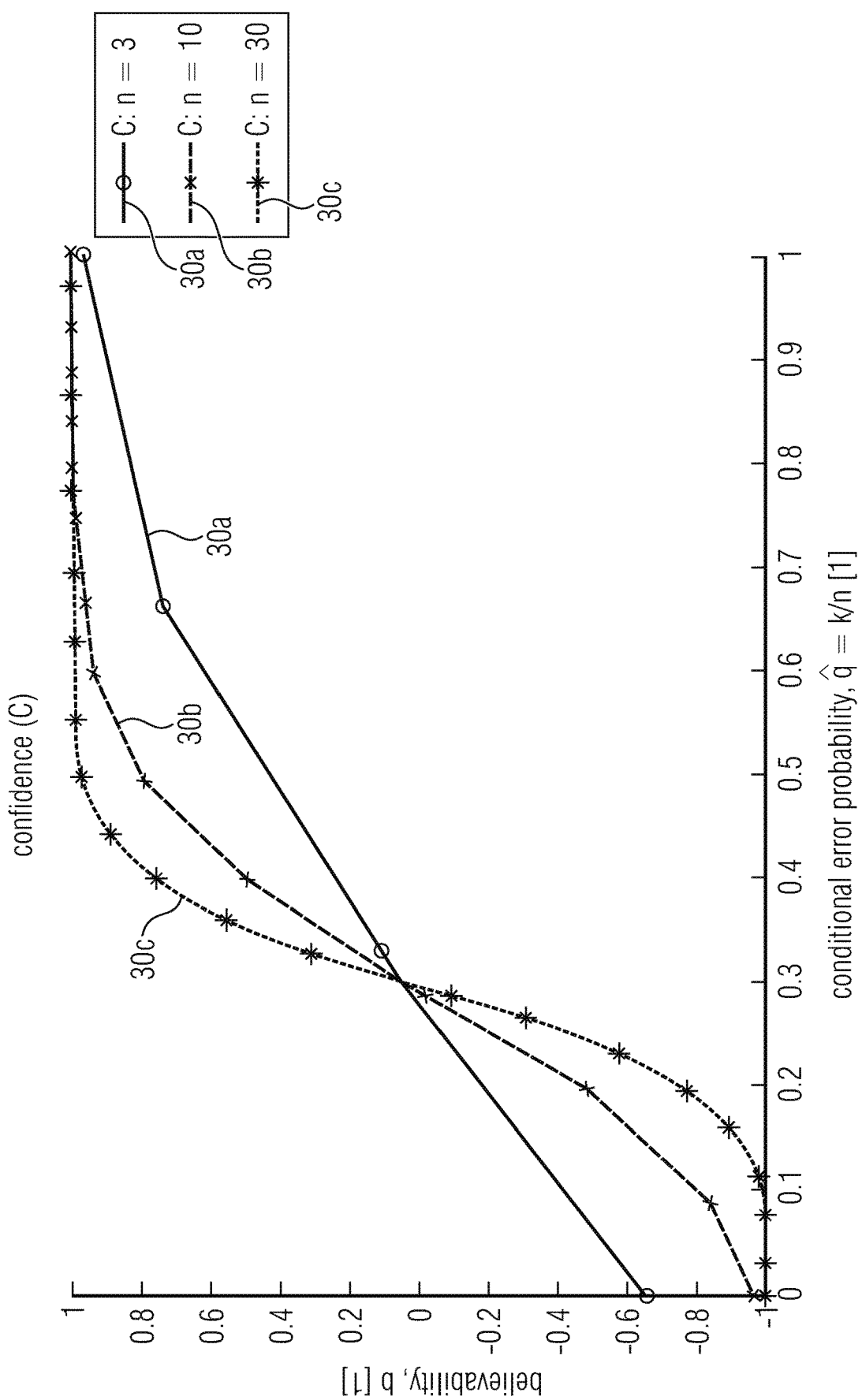
FIG. 8 shows a schematic line diagram indicating a believability factor based on confidence of deviation for different n and k=1 . . . n, as a function of k/n and fixed empirical conditional error probability $\hat{q}=0.2$.

FIG. 8 shows a line graph indicating the believability factor over the conditional error probability for n 3 30a, n=10 30b, and n=30 30c using confidence of deviation.

As expected, for small n, deviations of $\hat{q}$ from $\hat{Q}$ need to be large to be believable. For large n, much smaller deviations are believable.

According to further embodiments, the evaluation unit may be configured to calculate the probability measure using an average confidence of deviation [$b_{AvgConf}$] which is calculated as a means of deviations between a probability that an empirical error probability is greater or equal to an overall error probability and a probability that the empirical error probability is smaller than the overall error probability in a range from the empirical error probability and seen in dependence on input variables or the respective variable values of a given subset of the plurality of subsets of the predetermined input variables to the overall error probability.

Average Confidence of Deviation

Above definition (13) of the believability factor is based on the confidence level for the true conditional error probability q to deviate from $\hat{Q}$ at all, regardless how small the deviation is.

For investigating other deviations, the confidence difference $\Delta p = p_+ - p_-$ is now written as a function of conditional error probability q, $$\Delta p(q) = F_{n,q}(k-1) - (1 - F_{n,q}(k)). \tag{14}$$

Figure 9:
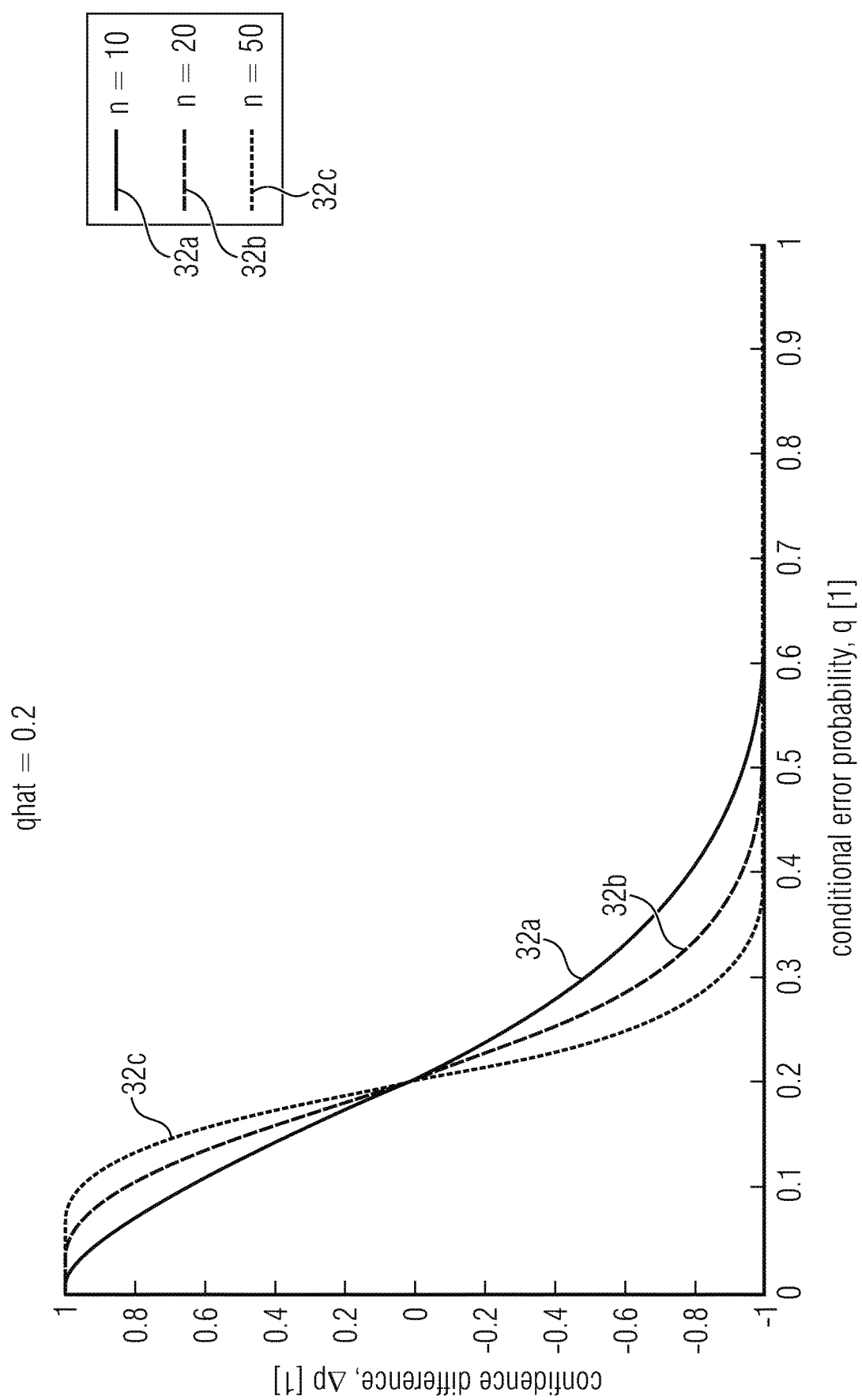
FIG. 9 shows a schematic line diagram indicating a confidence difference of $\Delta p$ as a function of true conditional error probability q for various n and fix empirical conditional error probability $\hat{q}=0.2$.

FIG. 9 shows a line graph indicating the confidence difference over the conditional error probability for n=10 32a, n=20 32b, and n=50 32c.

When the empirical conditional error probability is $\hat{q}=0.2$, the confidence (difference) is very high that the true conditional error probability is above 0 but very low that it is above large values.

Since the believability factor will be used to weight the empirical difference $\Delta\hat{q} = \hat{q} - \hat{Q}$, it is defined here as the average confidence for the true conditional error probability q being between overall error probability $\hat{Q}$ and empirical conditional error probability $\hat{q} = k/n$, forgiven k and n.

$$b_{AvgConf} = \Delta\bar{p} = \frac{1}{\hat{q} - \hat{Q}} \int_{\hat{Q}}^{\hat{q}} \Delta p(q) dq \tag{15}$$

Figure 10:
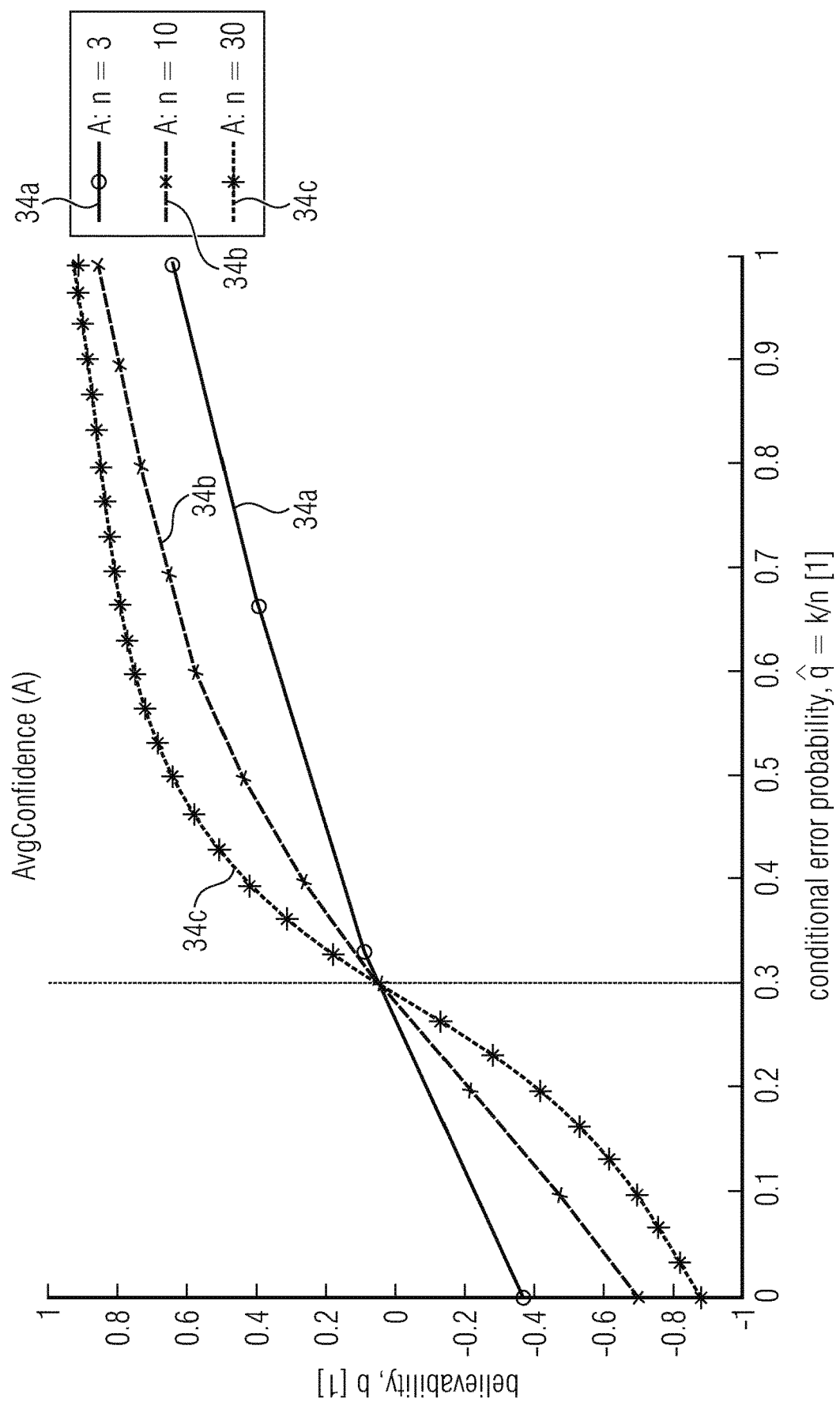
FIG. 10 shows a schematic line diagram indicating a believability factor based on average confidence of deviation for different n and k=1 . . . n, as a function of k/n and fix empirical conditional error probability $\hat{q}=0.2$.

FIG. 10 shows a line graph indicating the believability factor and the conditional error probability for n=3 34a, n=10 34b, and n=30 34c using average confidence of deviation.

According to further embodiments, the evaluation unit may be configured to calculate the believability measure using a variance of deviations [b] based on a ratio of a deviation between a number of errors in subranges of values of the input variables of a given subset of input variables and an expected number of errors in subranges of values of the input variables of the plurality of input variables based on an overall error probability and a standard deviation of numbers of errors. The standard deviation of numbers of errors may be determined in different subranges of the input variables, indicating a deviation of a subrange (e.g. each subrange) to an overall mean value of the numbers of errors in the data table.

In other words, yet another definition of the believability factor b is based on the ratio between the deviation $\Delta k = k - \hat{k}$ of the actual number of errors k from the expected number of errors $\hat{k} = \hat{Q}n$ based on the overall error probability and the standard deviation of the number of errors $\sigma_k$. When the difference $\Delta k$ is small compared to the standard deviation, it is not significant and is assigned believability close to 0. When the difference $\Delta k$ is large compared to the standard deviation, it is significant and is assigned believability close to +1 or −1, depending on its sign. A sigmoid function, such as arctan(.), ensures these limits.

$$b = \frac{2}{\pi} \arctan\frac{\Delta k}{\sigma_k} \tag{16}$$

Note, another possible sigmoid function is the error function, erf(.), however this leads to very stringent results and is thus not pursued further. The variance of binomially distributed number k of errors with probability $\hat{Q}$ is $\sigma_k^2 = n\hat{Q}(1-\hat{Q})$. With $\hat{q} = k/n$, $\Delta k = k - \hat{k}$, and $\hat{k} = \hat{Q}n$, believability (16) finally becomes:

$$b = \frac{2}{\pi} \arctan\frac{(\hat{q} - \hat{Q})\sqrt{n}}{\sqrt{\hat{Q}(1-\hat{Q})}} \tag{17}$$

Figure 11:
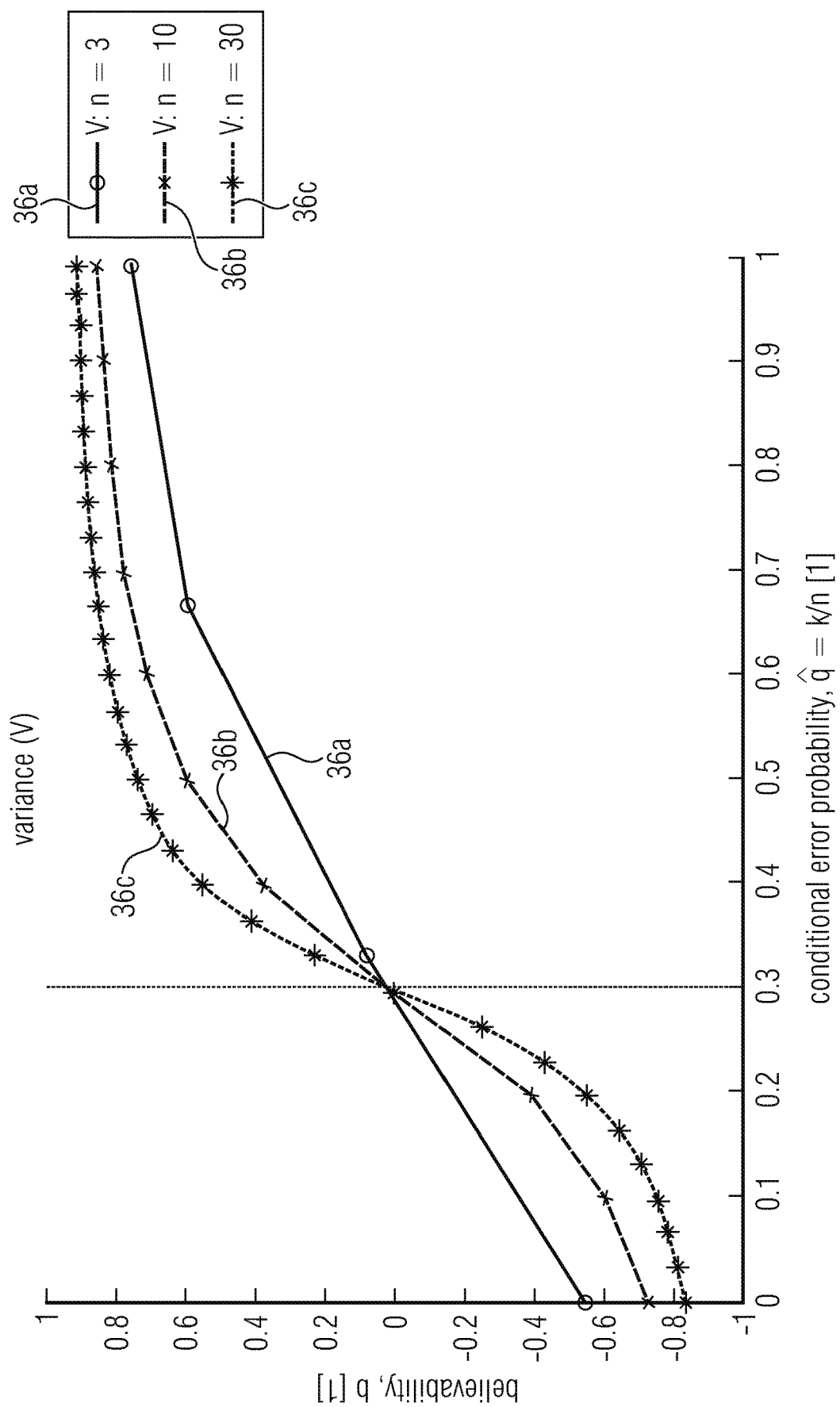
FIG. 11 shows a schematic line diagram indicating a believability factor based on a variance of deviation for different n and k=1 . . . n, and as a function of k/n and fix empirical conditional error probability $\hat{q}=0.2$.

FIG. 11 shows a line graph indicating the believability factor over the conditional error probability for n=3 38a, n=10 36b, and n=30 36c using variance of deviation.

Figure 12:
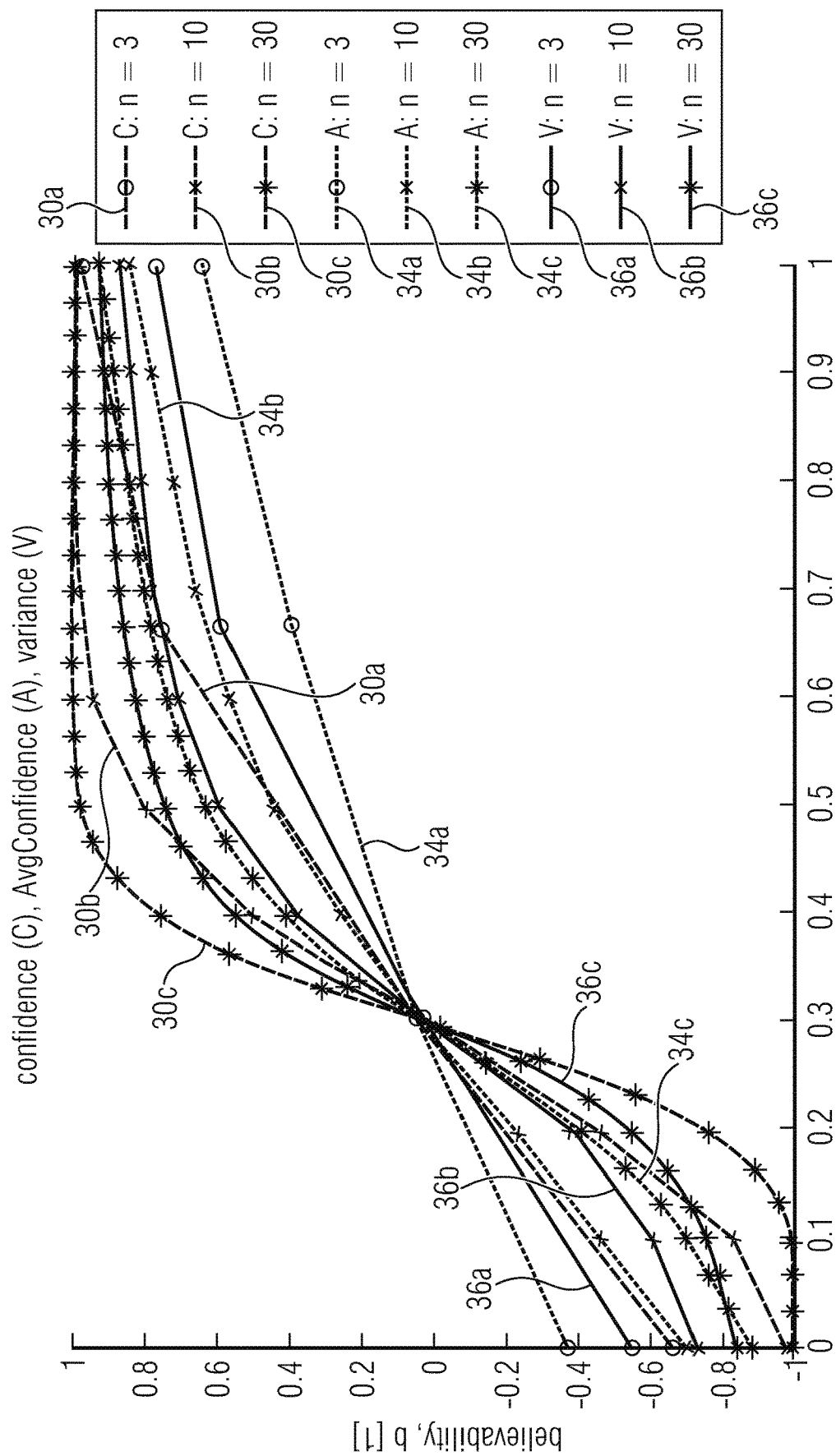
FIG. 12 shows a schematic line diagram indicating a believability factor based on confidence of deviation, average confidence of deviation, and variance of deviation for different n and k=1 . . . n, as a function of k/n and fix empirical conditional error probability $\hat{q}=0.2$.

Following in FIG. 12, the three proposed believability measures are compared. FIG. 12 shows a line graph indicating the line graphs of FIG. 8, FIG. 10, and FIG. 11 in one plot.

All three proposed measures show the same general dependency. 'Average confidence of deviation' 34a, 34b, 34c uses the highest number of samples to reach a given believability, 'Confidence of deviation' 30a, 30b, 30c the least number of samples, and 'Variance of deviation' 36a, 36b, 36c is somewhere in between. However, 'Variance of deviation' is clearly easiest to calculate. From now on 'Variance of deviation' will be used, unless otherwise noted.

Believable Entropy

Entropy is highest, and thus information lowest, when the probability distribution is flat. Information content is high, i.e. entropy is low, when the probability distribution has distinct deviations from average. The idea is thus smoothening statistically not believable deviations $\Delta\hat{q} = \hat{q} - \hat{Q}$ of the empirical conditional error probability $\hat{q}$ from the empirical overall error probability $\hat{Q}$ with the absolute value of above believability factor b, to obtain a believable deviation $\Delta\tilde{q}(x)$ of the conditional error probability distribution $$\Delta\tilde{q}(x) = \Delta\hat{q}(x) \cdot |b(x)|, \tag{18}$$

from which the believable conditional error probability $$\tilde{q}(x) = \hat{Q} - \Delta\tilde{q}(x), \tag{19}$$

and then the believable conditional entropy $\tilde{H}$ can be computed analog to equation (8). Note, the tilde (~) is meant to symbolize a smoothened version of the peaky hat (^).

$$\bar{H}(Y \mid X) = -\sum_{x \in X} \frac{n(x)}{N} \underbrace{[(1 - \bar{q}(x))\log_2(1 - \bar{q}(x)) + \bar{q}(x)\log_2 \bar{q}(x)]}_{-\bar{h}(x)} \tag{20}$$

-continued $$\overline{H}(Y|X) = \sum_{x \in X} \frac{n(x)}{N} \overline{h}(x)$$

The term $$\overline{h}(x) = -[(1+\tilde{q}(x))\log_2(1-\tilde{q}(x)) + \tilde{q}(x)\log_2 \tilde{q}(x)] \quad (21)$$

can be interpreted as entropy density of conditional error probability distribution q̃(x). It is maximum '1' when least is known about the conditional error probability, i.e. when it is constant (q̃=Q̂), and minimum '0' when conditional error probabilities vary widely between q̃=0% and q̃=100%.

q̃ corresponds to the number k̃ of believable errors.

$$\tilde{k}(x) = \tilde{q}(x) \cdot n(x) \quad (22)$$

Because above correction does not preserve the sum of errors K exactly, it is recomputed along with the corresponding conditional error probability $\overline{Q}$.

$$\overline{K} = \sum_{x \in X} \tilde{k}(x) \quad (23)$$

$$\overline{Q} = \frac{\overline{K}}{N} \quad (24)$$

Figure 13:
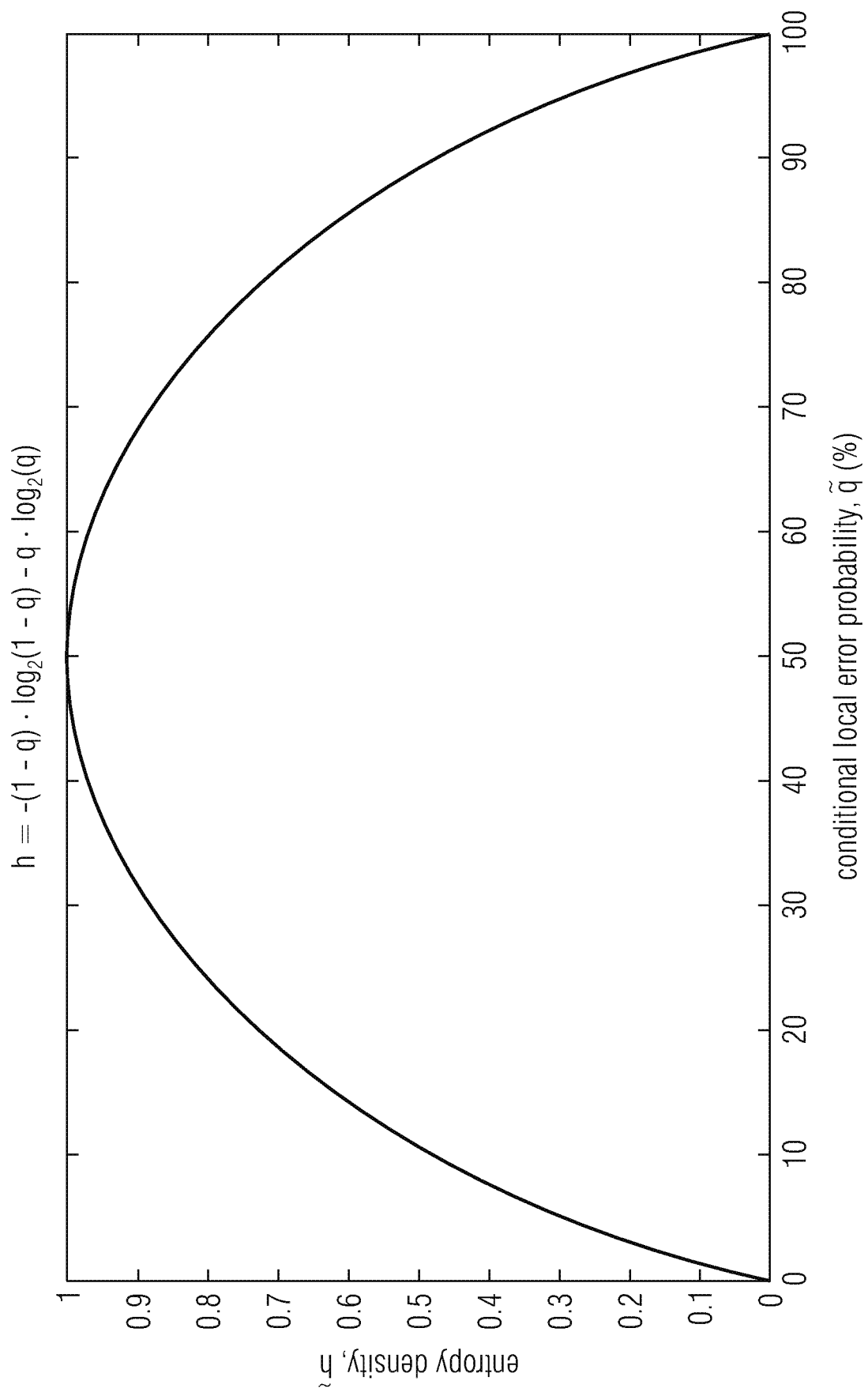
FIG. 13 shows a schematic two-dimensional diagram indicating an entropy density over a conditional low error probability.

FIG. 13 shows a schematic diagram indicating the entropy density over conditional local error probability.

Score

Finally a score of the statistically believable information in a plot is derived from the believable conditional entropy. This score shall range from 0 for non-informative to 1 for very informative and shall be comparable across different tuples X, including different numbers T of variables. The idea is to normalize the believable conditional entropy to its possible value range for a given overall error probability Q̂.

$$S_{info}(X) = 1 - \frac{\overline{H}(Y|X) - \overline{H}_{min}(Y|X)}{\overline{H}_{max}(Y|X) - \hat{H}_{min}(Y|X)} \quad (25)$$

For a given overall error probability Q̂ the conditional entropy is highest when the error probability is constant across all tuple values q̃(x)=Q̂ because this corresponds to least a-priori knowledge and therefore highest uncertainty. With $$N = \sum_{x \in X} n(x),$$

the maximum believable conditional entropy according to equation (20) becomes $$\hat{H}_{max}(Y|X) = -\sum_{x \in X} \frac{n(x)}{N} [(1-\hat{Q})\log_2(1-\hat{Q}) + \hat{Q}\log_2 \hat{Q}] \quad (26)$$

$$\overline{H}_{max} = -[(1-\hat{Q})\log_2(1-\hat{Q}) + \hat{Q}\log_2 \hat{Q}].$$

For a given Q̂, the entropy is lowest when all errors concentrate in one single tuple value with errors only. In this case the entropy is zero, $\hat{H}_{min}$=0. Both limits, $\hat{H}_{max}$ and $\overline{H}_{max}$ are independent of the chosen plot (Y,X) and thus ensure a score that is comparable across variable tuples.

$$S_{info}(X) = 1 - \frac{\overline{H}(Y|X)}{\hat{H}_{max}} \quad (27)$$

Local Score

For later comparison to other scores, such as z-score, above score $S_{info}(X)$ will now be written as average of local scores s(x) across all C tuple values $$S_{info}(x) = \frac{1}{C} \sum_{x \in X} s(x), \quad (28)$$

Now, the score $S_{info}(X)$ will be brought into form (28). With $$N = \sum_{x \in X} n(x)$$

and $\hat{H}_{min}$=0, equation (27) becomes $$S_{info}(x) = \sum_{x \in X} \frac{n(x)}{N} - \frac{1}{\hat{H}_{max}} \sum_{x \in X} \frac{n(x)}{N} \overline{h}(x). \quad (29)$$

Factoring out C and combining N/C to average number of test cases per variable combination, n̄=N/C, yields $$S_{info}(x) = \frac{1}{C} \left( \sum_{x \in X} \frac{n(x)}{\overline{n}} - \frac{1}{\hat{H}_{max}} \sum_{x \in X} \frac{n(x)}{\overline{n}} \overline{h}(x) \right) \quad (30)$$

$$= \frac{1}{C} \sum_{x \in X} \frac{n(x)}{\overline{n}} \left( 1 - \frac{\overline{h}(x)}{\hat{H}_{max}} \right),$$

so that the local score s(x) can be identified as $$s_{info}(x) = \frac{n(x)}{\overline{n}} \left( 1 - \frac{\overline{h}(x)}{\hat{H}_{max}} \right). \quad (31)$$

Comparison to z-Score

The z-score [Kumm-2012]

$$s_z(x) = \frac{(\hat{q}(x) - \hat{Q})\sqrt{n(x)}}{\sqrt{\hat{Q}(1-\hat{Q})}} \quad (32)$$

is also defined locally for a specific tuple value and can thus be compared to the proposed local score based on believable entropy, as defined in eq. (31).

Figure 14:
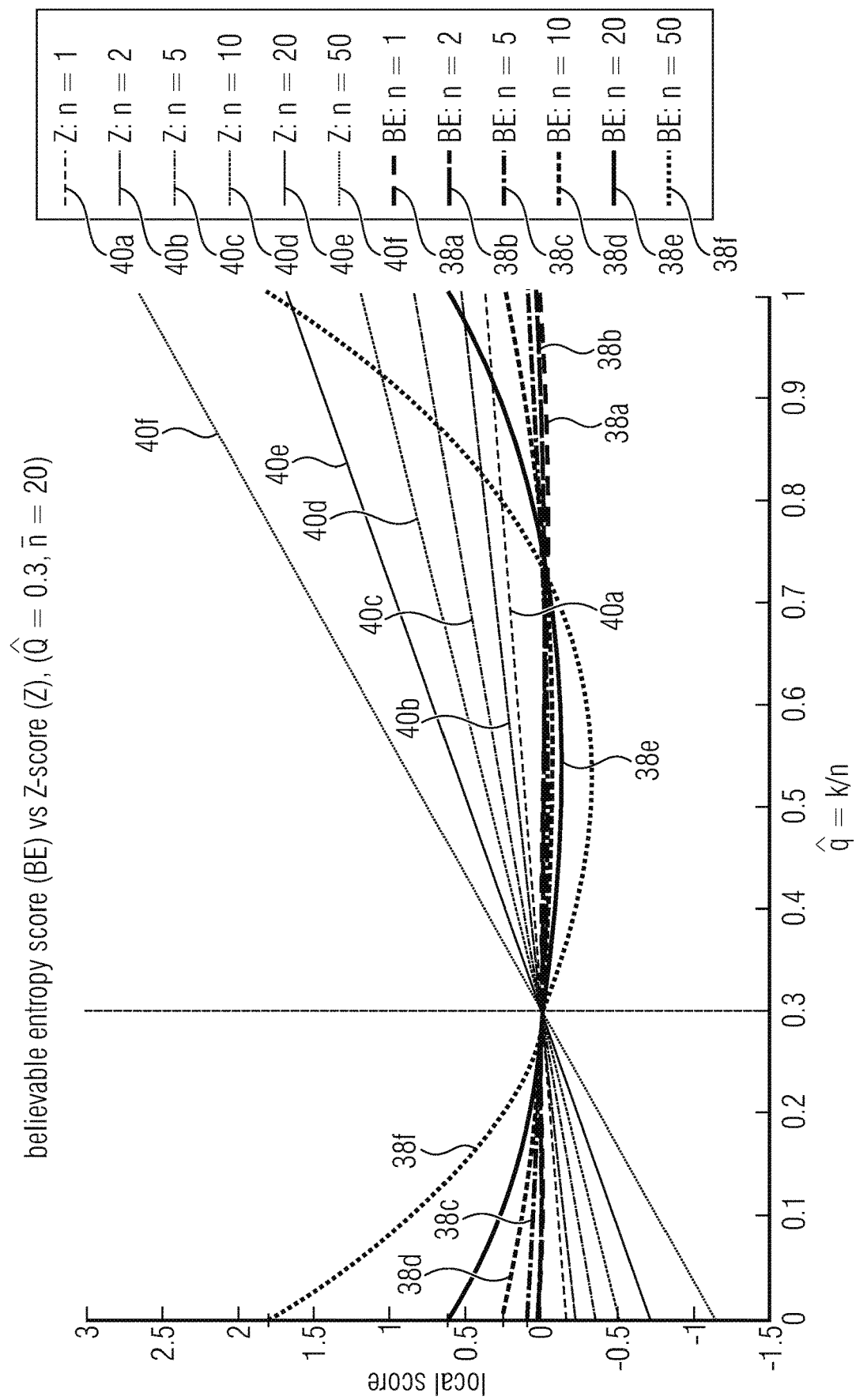
FIG. 14 shows a schematic line diagram indicating a comparison of a local believable conditional entropy score (BE) based on variance of deviation with conventional z-score (Z) for different n and k=1 . . . n.

FIG. 14 schematically indicates a comparison between the believable entropy score for n=1 38*a*, n=2 38*b*, n=5 38*c*, n=10 38*d*, n=20 38*e*, and n=50 38*f* and the corresponding z-score for n=1 40*a*, n=2 40*b*, n=5 40*c*, n=10 40*d*, n=20 40*e*, and n=50 40*f*.

The proposed score based on believable conditional entropy puts much more emphasis on extreme values in the probability distribution, whereas the conventional z-score is linear w.r.t. q̂. I.e., z-score is unbounded for growing n, which is not plausible. Furthermore, depending on overall error probability $\hat{Q}$, conventional z-score reaches different extremes (magnitude and sign) for very seldom or very frequent errors for a given variable combination, whereas the proposed score (BE) reaches the same extreme value for those cases. All are considered advantages of the proposed score.

Computation

Because $\hat{Q}$ is fix for a given data table, all proposed local scores depend only on k(x) and n(x) of the investigated variables tuples x. Local scores s(x) can be (pre-) computed as s(k,n) as needed and reused later.

The cumulative binomial distribution $F_{n,\hat{q}}(k)$, which is needed for some proposed local scores, can be well approximated [Wiki1] for $n\cdot\hat{Q}>5$ by a Gaussian distribution with mean $\mu_k = n\cdot\hat{Q}$, and variance $\sigma_n^2 = n\hat{Q}(1-\hat{Q})$ as $$F_{n,\hat{Q}}(k) \approx \frac{1}{2}\text{erf}\left(\frac{k+0.5-\mu_k}{\sqrt{2}\cdot\sigma_k}\right), \quad (33)$$

with continuity correction 0.5 and error function $$\text{erf}(x) = \frac{2}{\sqrt{\pi}}\int_0^x e^{-\xi^2}d\xi \quad (34)$$

Figure 15:
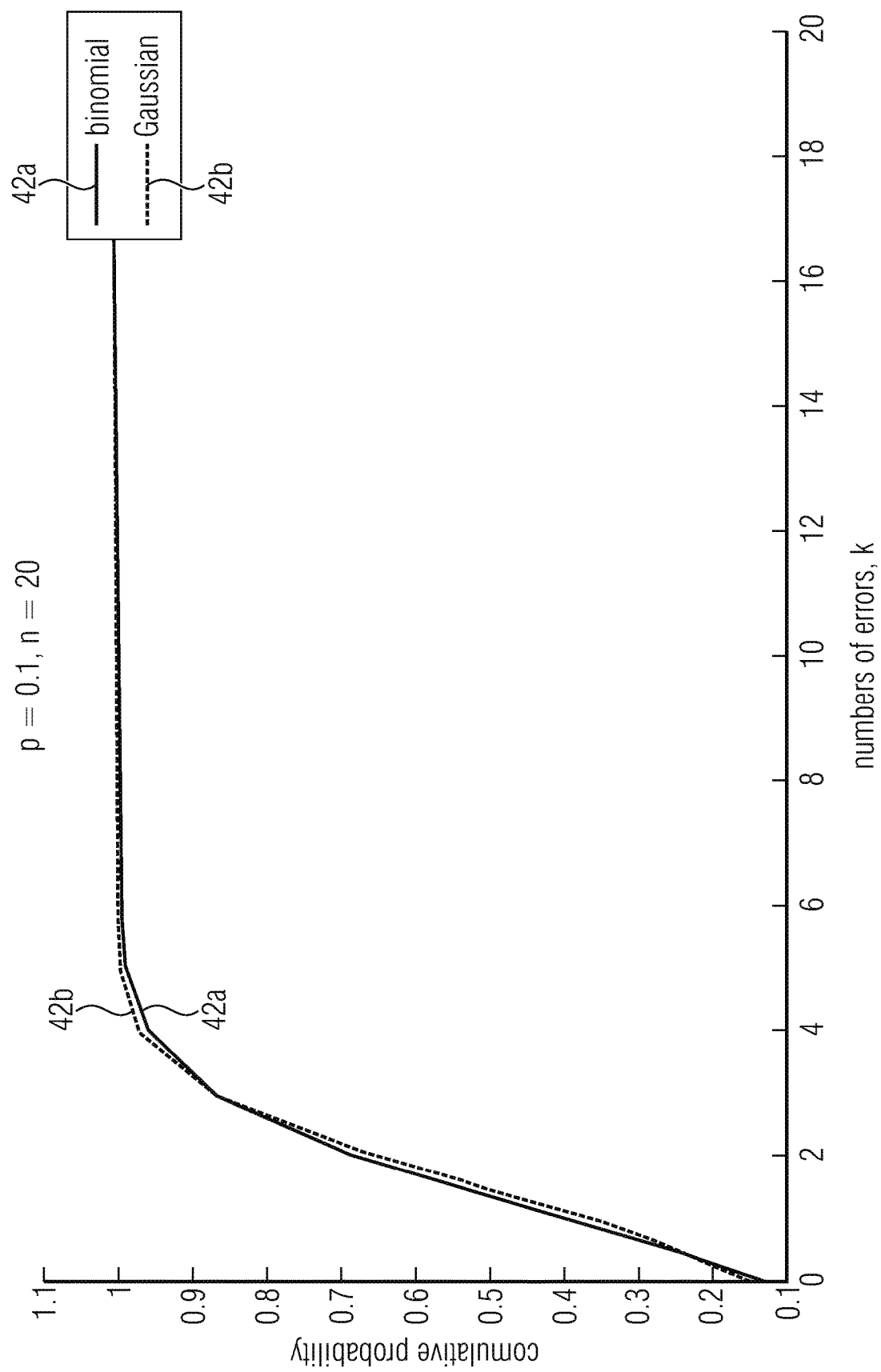
FIG. 15 shows a schematic line diagram indicating a comparison of a binomial distribution with approximating a Gaussian distribution.

FIG. 15 compares the correct cumulative binomial distribution 42a according to equation (9) with the approximating Gaussian distribution 42b according to equation (33) for $n\cdot p = 20\cdot 0.1 = 2$.

The approximation is reasonably good, although condition $n\cdot\hat{Q}>5$ is not met.

Figure 16:
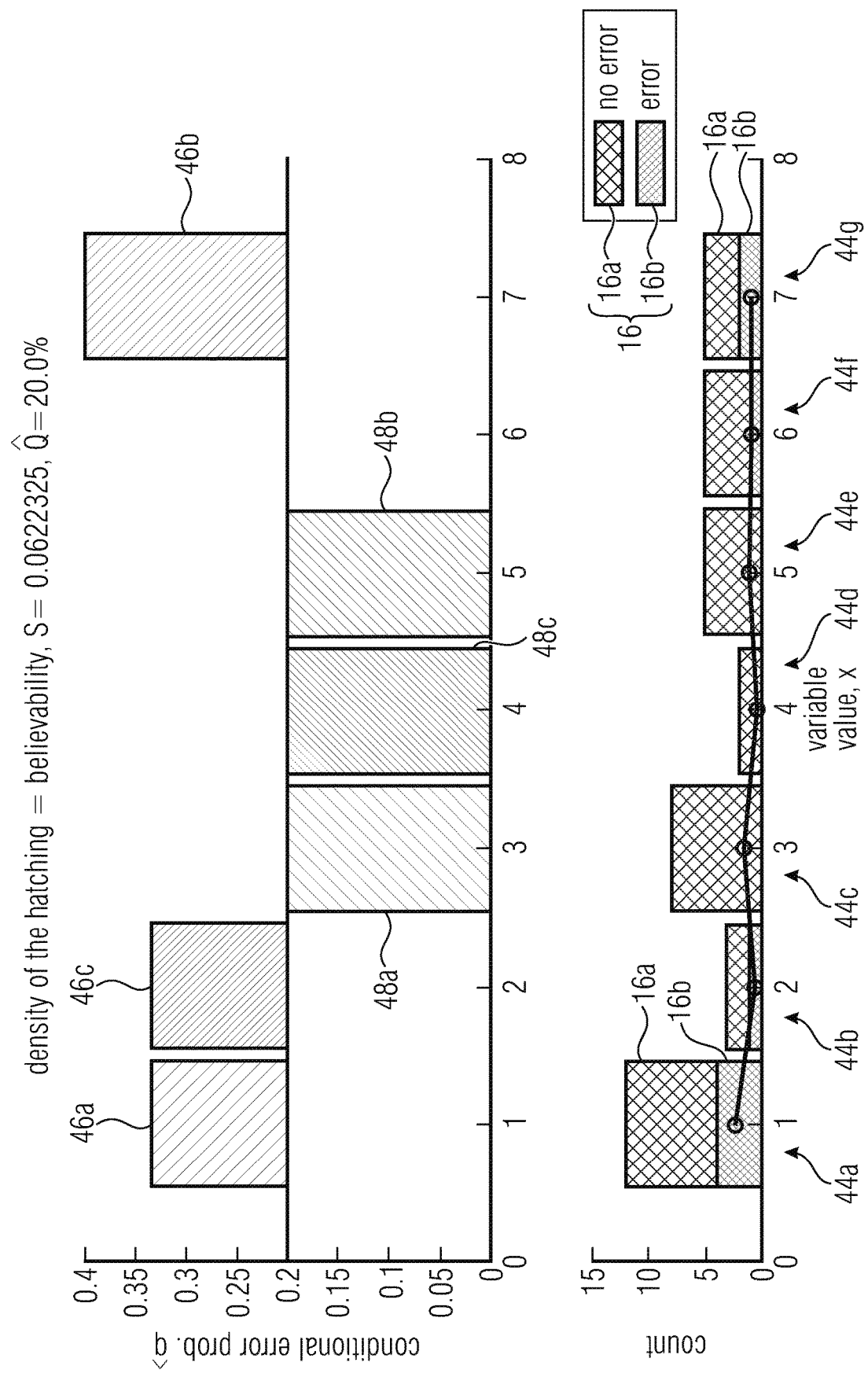
FIG. 16 shows schematic bar diagrams where the lower stacked bar graph shows the raw data with a number of errors and a number of non-errors for different values of variable u, wherein the upper bar chart shows the raw empirical conditional error probability, where the believability factor determines the density of the hatching, depending on whether there are more or fewer errors than on average, wherein the overall error probability is shown as a solid horizontal line.

The following FIG. 16 indicates an artificial example with 40 test cases across 7 variable values and overall error probability $\hat{Q}=20\%$.

Four errors 16b out of 12 test cases 16 (x=1) 44 is a more believable deviation than the same percentage out of three test cases (x=2) 44b. Thus, in the upper bar diagram of FIG. 16, the hatching 46a of the conditional error probability for x=1 44a is less dense (or wider) than the hatching 46c of x=2. Similarly, no error in eight test cases (x=3) 44c is a more believable deviation than no error in three cases (x=4) 44d. Therefore, the hatching 48c is more dense than the hatching 48a to indicate the lower believability. One error in five test cases (x=26) 44f corresponds to the 20% average and therefore to no deviation from average at all, such that no bar is indicated in the upper plot for x=6. Furthermore, no error in five test cases (x=5) 44e or two errors in five test cases (x=7) 44g deviate from average with only moderate believability which is indicated by a medium dense grid (hatching) 48b and 46b, respectively. The direction of the hatching from top left to bottom right of a bar indicates that the conditional error probability is higher than average and a hatching from bottom left to top right of a bar indicates a conditional error probability below average. In other words, the more test cases fall within one variable value or in a range of variable values (for example x=1 44a comprises a great number of 12 test cases when compare to the remaining variable values), the more likely or believable is the derived conditional error probability, such that the corresponding bar of the upper graph comprises a wide hatching indicating the high believability. In contrast, for x=2 44b, only three test cases and therefore a low number of test cases fall within this variable value range indicating a low believability and therefore, the hatching of the corresponding bar in the upper diagram comprises a dense hatching 46c.

In other words, the upper graph in FIG. 16 shows an example with one variable. For each variable value, the bar height, or area, is proportional to the deviation of the empirical conditional error probability Δq̂. More errors than on average are shown as bars having a hatching from top left to bottom right, fewer errors than average are shown as bars having a hatching from bottom left to top right. The density of the hatching is defined by the believability factor b, where a wider hatching indicates a higher believability. This way, the integrated hatching impression is proportional to the believable deviation of the conditional error probability, Δq̃=Δq̂·|b|.

Figure 17:
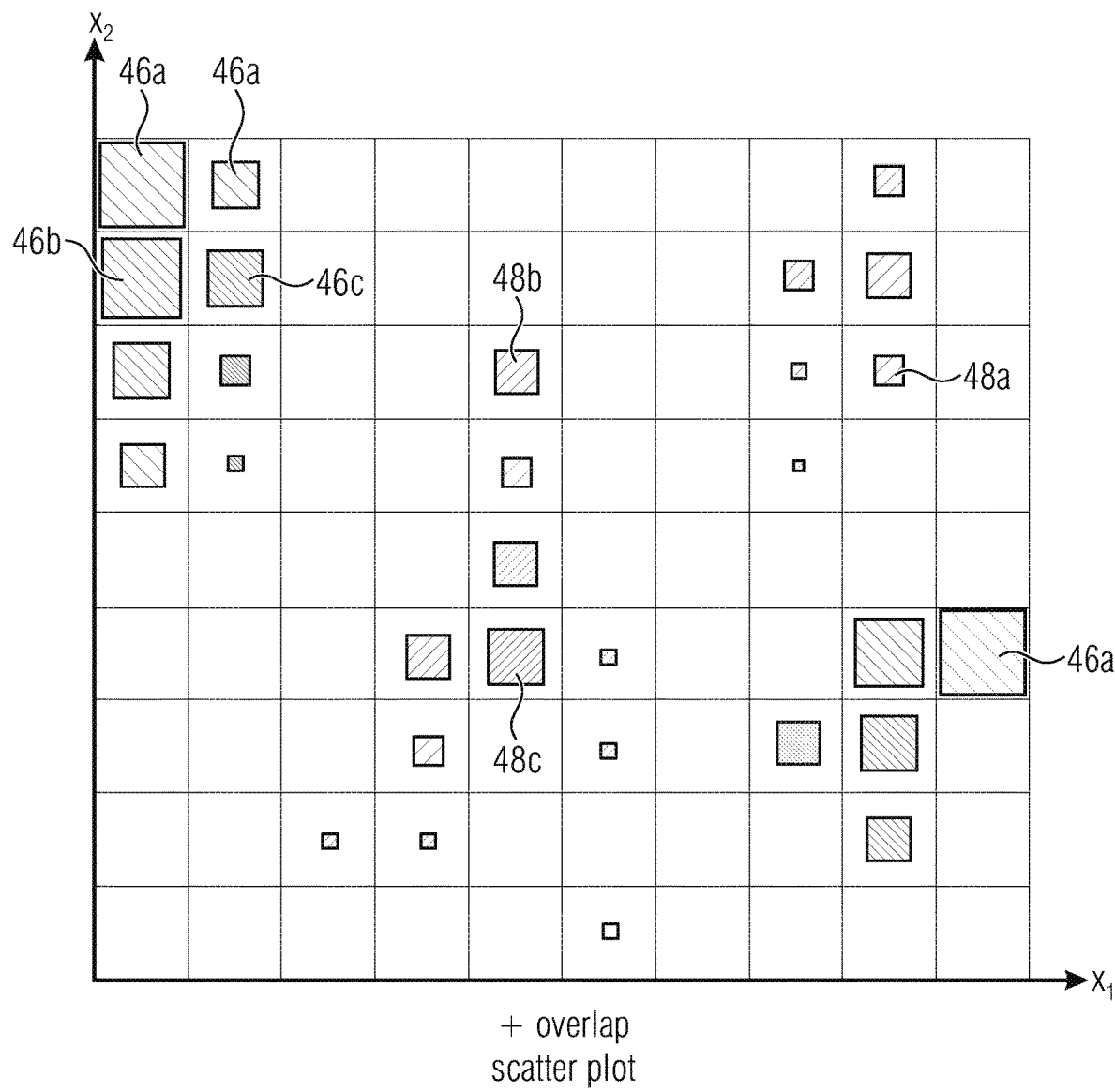
FIG. 17 shows a schematic diagram indicating a proposed visualization for two numerical variables $x_1$ and $x_2$ based on a distribution of a (not explicitly shown) overlayed scatter plot.

FIG. 17 shows an example with two continuous variables. It overlays a conventional scatter plot with squares for all quantized variable value combinations with thin grid lines at quantization boundaries.

A size of the square areas is proportional to deviations of the empirical conditional error probability Δq̃ q(x) from the average value, their direction of the hatchings are determined by the signs of b(x), and their density of the hatchings by the absolute values of b(x) as already described with respect to FIG. 16.

The largest occurring negative deviation $\Delta\hat{q}_{min}$ is mapped to 80% area when $|\Delta q_{min}|<80\%\cdot Q$, otherwise to 100%. $\Delta q=0$ is mapped to zero area. Similarly, the largest positive deviation $\Delta q_{max}$ is mapped to 80% area when $\Delta q_{max}<80\%\cdot(1-\hat{Q})$, otherwise to 100%. This relative scaling is used for situations with very seldom errors.

When one variable is categorical, multiple instances of the upper graph in FIG. 16 can be combined into one plot.

Recognizable Geometry

The proposed information score is based on conditional entropy, which is defined point wise and, as a result, is invariant under permutations of variables value combinations and can thus not capture geometric structure.

However, as discussed earlier, three geometric properties are of particular interest.

Number of error regions

Proximity to boundary

Compactness of error regions

In other words, the evaluation unit may be configured to determine the relevance scores using a geometrical measure of an error distribution within a value range covered by the values of the predetermined input variables for the subsets. The geometrical measure may be a heuristic applied to the error distributions described in the following and indicated, for example in FIG. 18.

Since, variables can be highly correlated there may be a choice of variables to optimize above three geometric properties. Correlation can come from FW constraints, and, even more so, from feature design, e.g. from equations the designers have added.

This section will define scores for above three geometric properties that are combined to an aggregate score for geometrically recognizable information.

$$S_{Geom} = \alpha_{Regions}S_{Regions} + \alpha_{Boundary}S_{Boundary} + \alpha_{Compact}S_{Compact} \quad (35)$$

Again, each score will be normalized to range [0,1], where 1 corresponds to most recognizable information. According to embodiments, the geometrical measure may be calculated as a weighted ($\alpha_{Regions}$, $\alpha_{Boundary}$, $\alpha_{Compact}$) sum of a score related to a number of error regions and/or a score related to a compactness of the error regions and/or a score related to the proximity of the error regions to the borders.

To be more precise, the evaluation unit may be configured to determine the geometrical measure based on conditional error probabilities within subranges of the subsets of input variables. The subranges or cells 50, as for example indicated in FIG. 18 may indicate quantization steps 52 within the range 54 covered by the values of the predetermined input variables for the subsets, i.e. $x_1$ and $x_2$ in FIG. 18.

Number of Error Regions

An idea for identifying error regions is applying a threshold to the conditional error probability of each cell 50 to identify error cells (such as error-prone subregions) 50' and then combine adjacent cells into error regions 56".

Error cells are identified by $$E = \{x : \Delta\tilde{q}(x) > \Delta q_0\} \subseteq X = X_1 x \ldots x X_T. \qquad (36)$$

FIG. 17 shows an example with two numeric variables $x_1$ and $x_2$, and one categorical variable $x_3$.

Therefore, the evaluation unit may be configured to define a threshold value of the conditional error probability in the subranges 50 to distinguish between error-prone subranges 50' and non-error-prone subranges 50" and to increase the geometrical measure with an increasing number of distinct error-prone subranges 56' and/or with an increasing number of groups 58" of adjacent error-prone subranges surrounded only by non-error-prone subranges 50".

Two (error) cells (or subregions), $e_i, e_j \in E$, are adjacent, $a(e_i, a_j) = $ true, when their values of quantized numerical tuple variables (variable numbers $1 \ldots T_{num}$) differ by no more than one quantization step and their values of categorical tuple variables (variable numbers $T_{num}+1 \ldots T$) are equal.

$$a(e_i, e_j) = \bigwedge_{t=1}^{T_{num}} \left( |x_t(e_i) - x_t(e_j)| \leq \frac{1}{|X|-1} \right) \wedge \bigwedge_{t=T_{num}+1}^{T} (x_t(e_i) = x_t(e_j)) \qquad (37)$$

The set of all error cells E is partitioned into R ted non-overlapping, contiguous error regions $E_r, r=1 \ldots R$, or formally:

$$\bigcup_{r=1}^{R} E_t = E$$

(partitions), $E_r \cap E_d, r \neq s$ (non-overlapping), $$\underset{e_j \in E_r}{\forall} \underset{e_j \in E_s}{\exists} \neg a(e_i, e_j)$$

(contiguous/neighboring/adjacent)

$$\underset{e_i \in E_r}{\forall} \underset{e_j \in E_r}{\forall} a(e_i, e_j)$$

(separated).

Partitioning can be done as follows: Start by assigning an initial error region number $r_i$ to each error cell $e_i \in E$ that is equal to its unique cell number, $r_i = c(e_i)$. For all error cells $e_i$ with $r_i = c(e_i)$, search for adjacent error cells $e_j$, $a(e_i, e_j)$-true. Whenever an adjacent cell $e_j$ is found, relabel all cells with current error region number $r_j$ to new error region number $r_i$. Finally, remove gaps in error region numbering to obtain contiguous error region numbers $r_i \in (1, \ldots, R)$. Now, each error cell is associated to its error region $r(e)$.

Figure 18:
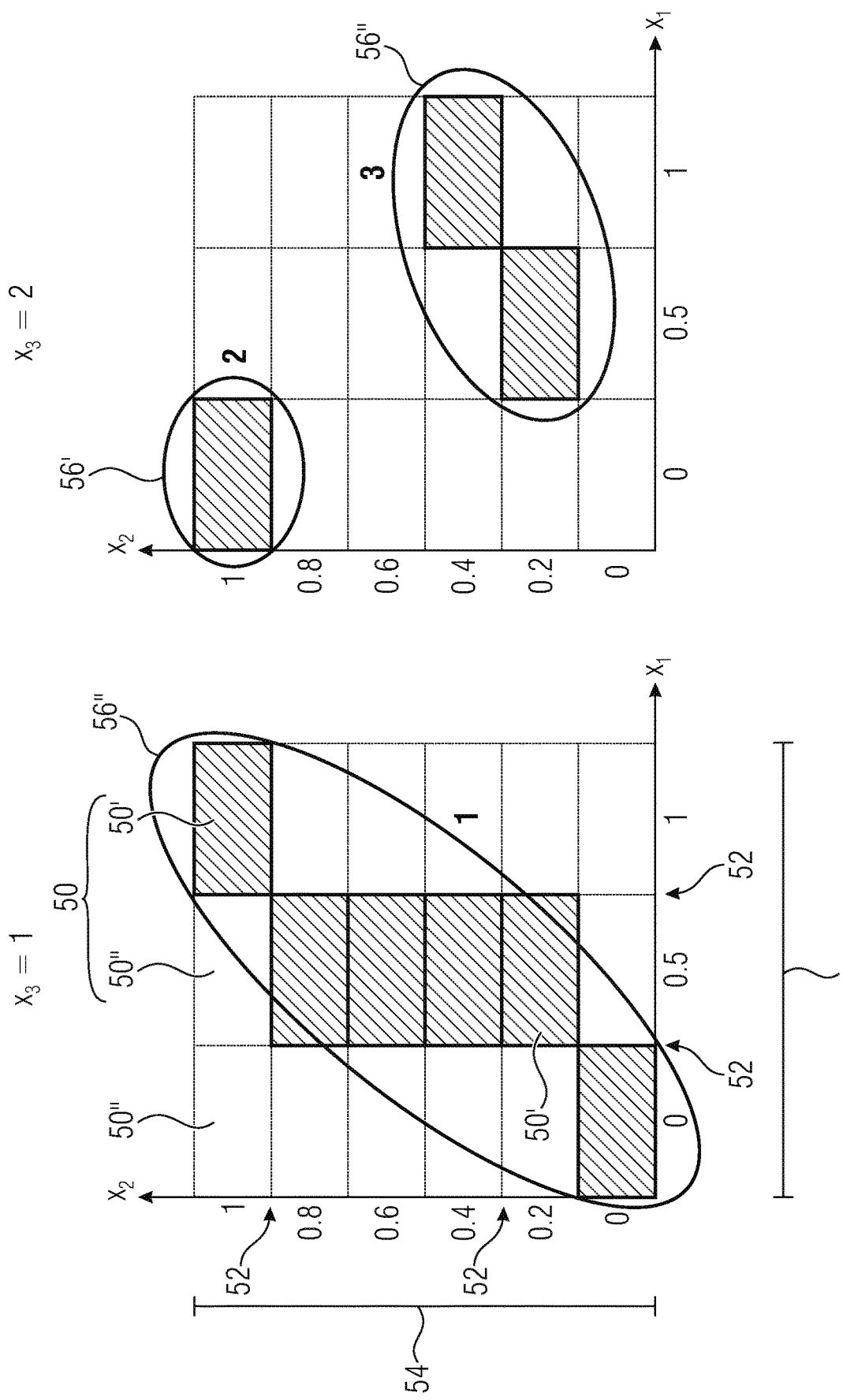
FIG. 18 shows a schematic diagram for three different variables, where $x_1$ and $x_2$ are quantized and normalized continuous variables and where $x_3$ is a binary variable thus providing an example of error cells with enlarged conditional error probability, distributed in three error regions.

The example in FIG. 18 contains R=3 error regions.

The score for the number of error regions is defined as $$S_{Regions} = \frac{1}{R}, \qquad (38)$$

such that the lowest possible number of errors, R=1, leads to the best score, $S_{Regions}=1$, whereas a large number of error regions leads to a low score near zero.

Compact Error Regions

Moreover, the evaluation unit may be configured to define a threshold value of the conditional error probability in the subranges to distinguish between error-prone subranges and non-error-prone subranges and to increase the geometrical measure with a decreasing size of groups of adjacent error-prone subranges surrounded only by non-error-prone subranges. This may indicate a compactness of the error regions. The threshold value may, for example, be chosen by the overall error probability of the whole data table.

In other words, in the most compact arrangement, all error cases are concentrated in one ceil, such as region 2 in FIG. 18. In this case the average cell distance to the region center is 0. In the least compact arrangement, almost half of the errors are each located in two opposite corners of the graph, with a few errors in connecting cells, such as region 1 in FIG. 18. In this case, the maximum average distance to the region center in $T_{num}$ dimensions is $$\overline{d}_{max} = \frac{\sqrt{T_{num}}}{2}. \qquad (39)$$

Therefore, score $S_{Compact}$ is defined based on the average distance $\overline{d}$ of alt error cases in error cells to their respective error region centers relative to the corresponding largest possible value $\overline{d}_{max}$ $$S_{Compact} = 1 - \frac{\overline{d}}{\overline{d}_{max}}. \qquad (40)$$

$\overline{d}$ is the average distance between error cells $e \in E$ and the center $\overline{e}_r$ of their respective error region $r(e)$, weighted with the number of errors $k(e)$ in each error cell e, $$\overline{d} = \frac{\sum_{e \in E} k(e) \|e' - \overline{e}'_{r(e)}\|}{\sum_{e \in E} k(e)}. \qquad (41)$$

$e' \in X_1 x \ldots x X_T$ denotes the numerical variable components of an error cell. Categorical variables can be ignored, because all error ceps in the same error region carry the same categorical variable values, due to adjacency definition (37).

The center $\overline{e}'_r$ of error region $E_r$ is the weighted average of the numerical tuple variable values in all cells, weighted with the numbers of errors $k(e)$ in each error cell.

$$\overline{e}'_r = \frac{\sum_{e \in E_r} k(e) \cdot e'}{\sum_{e \in E_r} k(e)} \qquad (42)$$

Proximity to Border

According to further embodiments, the evaluation unit may be configured to define a threshold value of the conditional error probability in the subranges to distinguish between error-prone subranges and non-error-prone subranges and to increase the geometrical measure with a decreasing distance of the error-prone subranges to a minimum and/or maximum values of the subranges. Therefore, the fact that error values located close to the borders of the value range, which may be for example normalized to values from 0 to 1, comprises a more valuable information regarding the influence of the values incorporated in the subranges to the errors of the device under test.

Score $S_{Border}$ will now be defined based on the average (normalized) distance of all error cases to their respective closest variable border. The distance of tuple value x to the closest border is $$d_{Border}(x) = \min_{t=1}^{T_{num}} \{\min(x_1, 1 - x_1)\}. \qquad (43)$$

Note, categorical variables are not included, because each categorical value is a 'border' value. The average closest distance across all error cases is $$\overline{d}_{Border} = \frac{1}{K} \sum_{x \in X} k(x) \cdot d_{Border}(x). \qquad (44)$$

Because a small distance to the closest border is favorable, the score is defined as $$S_{Border} = 1 - \overline{d}_{Border}. \qquad (45)$$

Embodiments show novel scores to quantify how insightful error plots of a subset of variables are. The three novel aspects are: (1) a believability factors takes statistically significance of seldom errors into account, and (2) geometrical aspects are taken into account to favor human recognizable information distributions. (3) believable probability deviations are visualized as color map to generic plots, such as bar charts or scatter plots. Furthermore, a tool has been proposed that automatically presents most insightful plots to the user.

According to further embodiments, the evaluation unit may be configured to quantize the variable values of the set of input variables for each test case for evaluating the multiple test cases based on the plurality of subsets of the predetermined input variables with quantized variable values with respect to the output value. Herein, one predetermined input variable may represent one dimension of the plot or the subset of input variables and wherein quantization borders in each dimension defines subranges of a value range covered by the values of the predetermined input variables. Moreover, the evaluation unit may count the total number of test cases [n(x)] situated in each subrange and to determine the number of test cases where an error occurred [k(x)] in each test case. Moreover, the evaluation unit may be configured to determine, for each subrange, an error probability, wherein the error probability indicates a ratio of the number of test cases where an error occurred to the total number of test cases. Furthermore, the evaluation unit may determine an entropy measure for each subset of the plurality of subsets of the plurality of input variables based on the total number of test cases in each subrange, the number of test cases where an error occurred in each subrange and the overall count of the multiple test cases. Based on the aforementioned steps or measures, the evaluation unit may calculate the relevance score using the entropy measure.

According to a further embodiment, the evaluation unit may determine a geometrical measure based on a distribution of errors once in independence of input variables on a given subset of the plurality of subsets of the predetermined input variables and to calculate the relevance score further using the geometrical measure.

Figure 19:
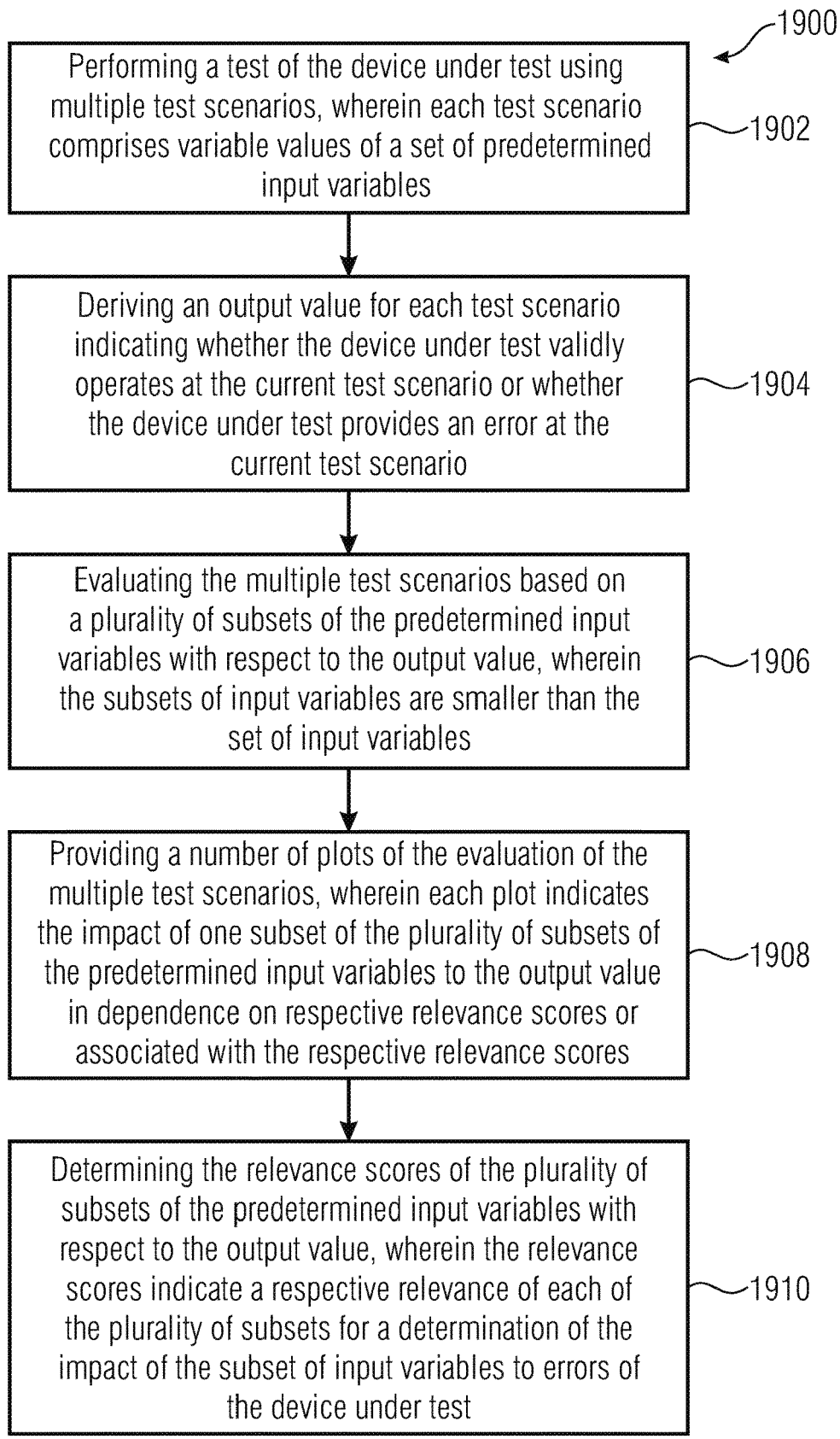
FIG. 19 shows a schematic block diagram of a method for testing a device under test.

FIG. 19 shows a schematic block diagram of a method for testing a device under test. The method 1900 comprises a step S1902 of performing a test of the device under test using multiple test cases, wherein each test case comprises variable values of a set of predetermined input variables, a step S1904 of deriving an output value for each test case indicating whether the device under test validly operates at the current test case or whether the device under test provides an error under the current test case, a step S1906 of evaluating the multiple test cases based on a plurality of subsets of the predetermined input variables with respect to the output value, wherein the subsets of input variables are smaller than a set of input variables, a step S1908 of providing a number of plots of the evaluation of the multiple test cases, wherein each plot indicates the impact of one subset of the plurality of subsets of the predetermined input variables to the output value in dependence on the respective relevance scores or associated with the respective relevance scores, and a step S1910 of determining the relevance scores of the plurality of subsets of the predetermined input variables with respect to the output value, wherein the relevance scores indicate a respective relevance of each of the plurality of subsets for a determination of the impact of the subset of input variables to errors of the device under test.

Although some aspects have been described in the context of an apparatus, it is clear that these aspects also represent a description of the corresponding method, such that a block or device of an apparatus also corresponds to a respective method step or a feature of a method step. Analogously, aspects described in the context of or as a method step also represent a description of a corresponding block or item or feature of a corresponding apparatus. Some or all of the method steps may be executed by (or using) a hardware apparatus, like, for example, a microprocessor, a programmable computer or an electronic circuit. In some embodiments, some or several of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray disc, a CD, an ROM, a PROM, an EPROM, an EEPROM or a FLASH memory, a hard drive or another magnetic or optical memory having electronically readable control signals stored thereon, which cooperate or are capable of cooperating with a programmable computer system such that the respective method is performed. Therefore, the digital storage medium may be computer-readable.

Some embodiments according to the invention include a data carrier comprising electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer.

The program code may, for example, be stored on a machine-readable carrier.

Other embodiments comprise the computer program for performing one of the methods described herein, wherein the computer program is stored on a machine-readable carrier. In other words, an embodiment of the inventive method is, therefore, a computer program comprising program code for performing one of the methods described herein, when the computer program runs on a computer.

A further embodiment of the inventive methods is, therefore, a data carrier (or a digital storage medium or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may, for example, be configured to be transferred via a data communication connection, for example via the Internet.

A further embodiment comprises processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer a computer program for performing at least one of the methods described herein to a receiver. The transmission can be performed electronically or optically. The receiver may, for example, be a computer, a mobile device, a memory device or the like. The apparatus or system may, for example, comprise a file server for transferring the computer program to the receiver.

In some embodiments, a programmable logic device (for example a field-programmable gate array, FPGA) may be used to perform some or all of the functionalities of the methods described herein. In some embodiments, a field-programmable gate array may cooperate with a microprocessor in order to perform one of the methods described herein. Generally, in some embodiments, the methods are performed by any hardware apparatus. This can be universally applicable hardware, such as a computer processor (CPU), or hardware specific for the method, such as ASIC.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCES

[Cov-2006] Thomas M. Cover, Joy A. Thomas: Elements of Information Theory, second Edition, Wiley 2006

[Doq-2011] Gauthier Doquire, Michel Verleysen: An Hybrid Approach to Feature Selection for Mixed Categorical and Continuous Data, Proceedings of the international Conference on Knowledge Discovery and Information Retrieval, pages 394-401, 2011

[Fleu-2004] Francois Fleuret: Fast Binary Feature Selection with Conditional Mutual Information, Journal of Machine Learning Research 5, pages 1531-1555, 2004

[Kumm-2012] Olena Kummer, Jacques Savoy: Feature Selection in Sentiment Analysis, CORIA 2012, pp. 273-284

[Wiki1] Wikipedia: Binomial Distribution, https://en.wikipedia.org/wiki/Binomial_distribution Nomenclature

|X| Number of elements in set X.

$\alpha_{name}$ Weight parameter for score $S_{Name}$ $a(e_i, e_j)$ Adjacency function is true when error cells $e_i$ and $e_j$ are adjacent.

$B_{n,p}(k)$ Probability of finding exactly k binomially distributed errors of probability p in a test cases.

b(x) Believability factor for tuples value x.

c(x),C Unique (cell) number of tuple value x, number of cells (tuple values).

$\bar{d}, \bar{d}_{max}$ Average distance of error cells to their error region centers, max possible $\bar{d}$.

$d_{Border}(x), \bar{d}_{Border}$ Distance of tuple value x to closest border, average distance across tuple values to closest border.

$E, E_r$ Set of all error cells, set of error cells in error region $r_i$.

$e_i, e'_i, \bar{e}'_r$, error cell i, numerical variable components of error cell, center of error region $E_r$ $E_p\{f(X)\}$ Expectation of function f of random variable X with probability distribution p(x).

erf(x) Error function of random variable x.

$F_{n,p}(k)$ Cumulative probability of finding up to k binomially distributed errors of probability p in n test cases.

$H, \hat{H}, \check{H}, \check{H}_{max}$ Entropy, empirical entropy, believable entropy, maximum of believable entropy.

$\check{h}$ Density of believable entropy.

$K, k(x), K_r$ Overall number of errors in data table, number of errors for tuple value x, number of errors in error region r.

M,m Number of all variables in data table, index of a specific date table variable.

$N, n, n(x), \bar{n}$ Overall number of test cases, number of test cases for tuple value x, average number of test cases across al cells.

$p(y|x), \hat{p}(y|x)$ True/empirical joint conditional probability of $y \in Y$ assuming a tuple value x.

$Q, \hat{Q}$ True/empirical error probability across al test cases.

$q(x), \hat{q}(x), \check{q}(x)$ True/empirical/believable conditional error probability distribution for tuple value x.

Pr(X=x) Probability that random variable X has value x.

R,r,r(e) Number of error regions, index of error region, region index of error call e.

S(X) Score to assess insightfulness of error plot with variables $X_1, \ldots, X_T$.

s(x) Local score for tuple value x.

$T, T_{num}, t$ Number of tuple variables, number of numerical tuple variables, index of tuple variable.

$v_m(n), V_m$ Value of data table variable m in test case n, set of values of variable m.

$x_t(n), X_t$ Value of tuple variable t in test case n, set of values of tuple variable t y(n),Y Value of error variable in test case n, set of (binary) values of error variable.

The invention claimed is:

1. A tester for testing a device under test, the tester comprising:
   a memory;
   a processor configured to execute instructions stored in the memory, wherein the instructions implement a test unit and an evaluation unit;
   the test unit configured for performing a test of the device under test using multiple test cases, wherein each test case of the multiple test cases comprises variable values of a set of predetermined input variables and wherein the test unit is configured to derive an output value for a respective test case, wherein the output value indicates if the device under test provides a valid response for a current test case or whether the device under test provides an error in response to the current test case; and
   the evaluation unit configured to:
      evaluate each of the multiple test cases based on a plurality of subsets of the set of predetermined input variables and a respective resultant output value, and wherein each of the subsets of the set of predetermined input variables are smaller than the set of predetermined input variables;
      provide a number of plots associated with an evaluation of the multiple test cases, wherein each plot indicates an impact of one subset of the plurality of subsets of the set of predetermined input variables to the respective resultant output value of a test case using a relevance score; and
      determine the relevance score for each of the plurality of subsets of the set of predetermined input variables resulting in relevance scores, wherein each respective relevance score indicates a respective relevance of each of the plurality of subsets when determining an impact of the plurality of subsets of the set of predetermined input variables on errors of the device under test,
   wherein the evaluation unit is further configured to determine the relevance scores using entropy measures, wherein the evaluation unit is further configured to determine the entropy measures using:
      a conditional entropy of an error distribution resulting if a particular subset of the plurality of subsets of the set of predetermined input variables comprises a number of predetermined input variables that is greater than 1; or
      an entropy of an error distribution resulting if a particular subset of the plurality of subsets of the set of predetermined input variables comprises a number of predetermined input variables that is equal to 1, and
   wherein the evaluation unit is configured to calculate believability measures, wherein the believability measures indicate a statistical uncertainty of an error distribution resulting from a dependence of a respective one of the plurality of subsets on one or more predetermined input variables of a particular subset of the plurality of subsets and wherein the evaluation unit is further configured to adjust the entropy measures using the believability measures to decrease the relevance scores of the subsets of the plurality of subsets of the set of predetermined input variables with an increasing statistical uncertainty and to increase the relevance scores of the subsets of the plurality of subsets of the set of predetermined input variables with a decreasing statistical uncertainty.

2. The tester according to claim 1, wherein the evaluation unit is further configured to calculate the believability measures using a confidence of deviation of the error, wherein the confidence of deviation is calculated using a computation of a deviation that a probability between an empirical error probability of a particular subset is greater or equal to an overall error probability and a probability that the empirical error probability of the particular subset is smaller than the overall error probability.

3. The tester according to claim 1, wherein the evaluation unit is further configured to calculate the believability measures using an average confidence of deviation, wherein the average confidence is calculated as a mean of deviations between a probability that an empirical error probability is greater or equal to an overall error probability and a probability that the empirical error probability is smaller than the overall error probability in a range from the empirical error probability when determined in dependence on input variables of a particular subset of the plurality of subsets of the set of predetermined input variables to the overall error probability.

4. The tester according to claim 1, wherein the evaluation unit is further configured to calculate the believability measures using a variance of deviation based on a ratio of:
   a deviation between a number of errors in subranges of values of input variables of a particular subset of predetermined input variables and an expected number of errors in subranges of values of input variables of the set of predetermined input variables based on an overall error probability; and
   a standard deviation of numbers of errors.

5. The tester according to claim 1, wherein the evaluation unit is further configured to determine the relevance scores using a geometrical measure of an error distribution within a value range covered by values of predetermined input variables in the plurality of subsets of the set of predetermined input variables.

6. The tester according to claim 5, wherein the evaluation unit is further configured to determine the geometrical measure based on conditional error probabilities within subranges of the plurality of subsets of the set of predetermined input variables.

7. The tester according to claim 6, wherein the evaluation unit is further configured to define a threshold value of a conditional error probability in the subranges that distinguishes between error-prone subranges and non-error-prone subranges and to increase the geometrical measure with an increasing number of distinct error-prone subranges.

8. The tester according to claim 6, wherein the evaluation unit is further configured to define a threshold value of a conditional error probability in the subranges that distinguishes between error-prone subranges and non-error-prone subranges and to increase the geometrical measure with a decreasing size of groups of adjacent error-prone subranges surrounded by one or more non-error-prone subranges.

9. The tester according to claim 6, wherein the evaluation unit is further configured to define a threshold value of a conditional error probability in the subranges that distinguishes between error-prone subranges and non-error-prone subranges and to increase the geometrical measure with a decreasing distance of the error-prone subranges to minimum and/or maximum values of the subranges.

10. The tester according to claim 1, wherein the evaluation unit is further configured to calculate a relevance score using a weighted sum of an entropy measure and a geometrical measure.

11. The tester according to claim 1, wherein the evaluation unit is further configured to rank the number of plots according to the relevance scores and to provide the number of plots to a user of the tester based on the ranking.

12. The tester according to claim 1, wherein the evaluation unit is further configured to calculate a transformation variable using, for each test case, at least two variable values of input variables and to extend the set of input variables by the transformation variable, wherein an extended set of predetermined input variables is formed and wherein the evaluation unit is further configured to evaluate the multiple test cases based on the plurality of subsets of the extended set of predetermined input variables.

13. The tester according to claim 12, wherein the evaluation unit is further configured to perform a coordinate transform, wherein a functional dependency of the set of predetermined input variables is achieved, and wherein variable values of the set of predetermined input variables are used to calculate the transformation variable.

14. The tester according to claim 12, wherein a count of the plurality of subsets of the extended set of predetermined input variables is smaller than or equal to 4.

15. The tester according to claim 1,
wherein the evaluation unit is further configured to:
quantize the variable values of the set of predetermined input variables for each test case for evaluating the multiple test cases based on the plurality of subsets of the set of predetermined input variables with quantized variable values in relation to the output value, wherein one predetermined input variable represents one dimension of the plot and wherein quantization borders in each dimension define subranges of a value range covered by the variable values of the predetermined input variables;
count total number of test cases situated in each subrange and to determine a number of test cases where an error occurred in each test case;
determine for each subrange an error probability that indicates a ratio of the number of test cases where an error occurred to the total number of test cases;
determine an entropy measure for each subset of the plurality of subsets of the set of predetermined input variables based on the total number of test cases in each subrange, a number of test cases where an error occurred in each subrange and a overall count of the multiple test cases; and
calculate the relevance score using the entropy measure.

16. The tester according to claim 15, wherein the evaluation unit is further configured to determine a geometrical measure based on a distribution of errors resulting from a dependence on input variables of a particular subset of a plurality of subsets of the set of predetermined input variables and to calculate the relevance score further using the geometrical measure.

17. The tester according to claim 6, herein the evaluation unit is further configured to define a threshold value of a conditional error probability in the subranges that distinguishes between error-prone subranges and non-error-prone subranges and to increase the geometrical measure with an increasing number of groups of adjacent error-prone subranges surrounded by non-error-prone subranges.

18. A method for testing a device under test, the method comprising:
performing a test of the device under test using multiple test cases, wherein each test case comprises variable values of predetermined input variables;
deriving an output value for each test case indicating whether the device under test validly operates or provides an error at a current test case;
evaluating the multiple test cases based on a plurality of subsets of the predetermined input variables in relation to a respective output value, and wherein the subsets of the predetermined input variables are smaller than a total count of the predetermined input variables;
providing a plurality of plots associated with an evaluation of the multiple test cases, wherein each plot of the plurality of plots indicates an impact of one subset of the plurality of subsets of the predetermined input variables to the respective output value using a relevance score;
determining the relevance score for each of the plurality of subsets of the predetermined input variables, wherein each respective relevance score indicates a respective relevance of each of the plurality of subsets when determining an impact of the plurality of subsets of the predetermined input variables on errors of the device under test, wherein the determining comprises:
determining the relevance scores using entropy measures using:
a conditional entropy of an error distribution resulting if a particular subset of the plurality of subsets of the predetermined input variables comprises a number of predetermined input variables that is greater than 1; or
an entropy of an error distribution resulting if a particular subset of the plurality of subsets of the predetermined input variables comprises a number of predetermined input variables that is equal to 1; and
calculating believability measures, wherein the believability measures indicate a statistical uncertainty of an error distribution resulting from a dependence of a respective one of the plurality of subsets on one or more predetermined input variables of a particular subset of the plurality of subsets and wherein the entropy measures are operable to be adjusted using the believability measures to decrease the relevance scores of the subsets of the plurality of subsets of the predetermined input variables with an increasing statistical uncertainty and to increase the relevance score of the subsets of the plurality of subsets of the predetermined input variables with a decreasing statistical uncertainty.

19. A non-transitory digital storage medium having stored thereon a computer program for performing a method of testing a device under test, the method comprising:
performing a test of the device under test using multiple test cases, wherein each test case comprises variable values of predetermined input variables;
deriving an output value for each test case indicating whether the device under test validly operates or provides an error at a current test case;
evaluating the multiple test cases based on a plurality of subsets of the predetermined input variables in relation to a respective output value;
providing a plurality of plots associated with an evaluation of the multiple test cases, wherein each plot of the plurality of plots indicates an impact of one subset of the plurality of subsets of the predetermined input variables to the respective output value using a relevance score; and
determining the relevance score for each of the plurality of subsets of the predetermined input variables, wherein each respective relevance score indicates a respective relevance of each of the plurality of subsets when determining an impact of the plurality of subsets of the predetermined input variables on errors of the device under test, wherein the determining comprises:

determining the relevance scores using entropy measures using:
- a conditional entropy of an error distribution resulting if a particular subset of the plurality of subsets of the predetermined input variables comprises a number of predetermined input variables that is greater than 1; or
- an entropy of an error distribution resulting if a particular subset of the plurality of subsets of the predetermined input variables comprises a number of predetermined input variables that is equal to 1; and calculating believability measures, wherein the believability measures indicate a statistical uncertainty of an error distribution resulting from a dependence of a respective one of the plurality of subsets on one or more predetermined input variables of a particular subset of the plurality of subsets and wherein the entropy measures are operable to be adjusted using the believability measures to decrease the relevance scores of three subsets of the plurality of subsets of the predetermined input variables with an increasing statistical uncertainty and to increase the relevance score of the subsets of the plurality of subsets of the predetermined input variables with a decreasing statistical uncertainty.

* * * * *